US012681076B2

(12) United States Patent
You et al.

(10) Patent No.: US 12,681,076 B2
(45) Date of Patent: Jul. 14, 2026

(54) HIGH VOLTAGE INTEGRATED CIRCUIT TESTING INTERFACE ASSEMBLY

(71) Applicant: Texas Instruments Incorporated, Dallas, TX (US)

(72) Inventors: Ming-Chuan You, New Taipei City (TW); Andrew Patrick Couch, Allen, TX (US); Phillip Marcus Blitz, Garland, TX (US); Xinkun Huang, McKinney, TX (US); Chi-Tsung Lee, New Taipei City (TW); Roy Deidrick Solomon, Melissa, TX (US); Enis Tuncer, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 29 days.

(21) Appl. No.: 17/158,994

(22) Filed: Jan. 26, 2021

(65) Prior Publication Data

US 2021/0231729 A1    Jul. 29, 2021

Related U.S. Application Data

(60) Provisional application No. 62/966,166, filed on Jan. 27, 2020.

(51) Int. Cl.
*G01R 31/28* (2006.01)

(52) U.S. Cl.
CPC ..... *G01R 31/2853* (2013.01); *G01R 31/2887* (2013.01); *G01R 31/2889* (2013.01)

(58) Field of Classification Search
CPC .............. G01R 1/0408; G01R 31/2853; G01R 31/2886; G01R 31/2889

USPC ...................................................... 324/750.16
See application file for complete search history.

(56) References Cited

U.S. PATENT DOCUMENTS

| | | | | | |
|---|---|---|---|---|---|
| 4,410,227 | A | * | 10/1983 | Prunella | G01R 31/2886 324/754.13 |
| 4,419,626 | A | * | 12/1983 | Cedrone | G01R 1/0466 439/70 |
| 4,956,604 | A | * | 9/1990 | Cedrone | G01R 1/0433 439/70 |
| 6,104,183 | A | * | 8/2000 | Kobayashi | G01R 31/2868 324/757.04 |

(Continued)

FOREIGN PATENT DOCUMENTS

| | | | | | |
|---|---|---|---|---|---|
| JP | H07297359 | A | * | 11/1995 | H01L 23/52 |
| JP | 2001066345 | A | * | 3/2001 | G01R 31/26 |

OTHER PUBLICATIONS

JPH07297359A Multi-Chip Module and Connector for the Same (Year: 1995).*

(Continued)

*Primary Examiner* — Eman A Alkafawi
*Assistant Examiner* — Courtney G McDonnough
(74) *Attorney, Agent, or Firm* — Ronald O. Neerings; Frank D. Cimino

(57) ABSTRACT

An integrated circuit testing assembly that includes: (i) a first slug configured to contact a first surface of a first set of pins of an integrated circuit; (ii) a second slug configured to contact a second surface of the first set of pins of the integrated circuit; (iii) a third slug configured to contact a first surface of a second set of pins of the integrated circuit; and (iv) a fourth slug configured to contact a second surface of the second set of pins of the integrated circuit.

23 Claims, 25 Drawing Sheets

(56)                   References Cited

U.S. PATENT DOCUMENTS

| | | | |
|---|---|---|---|
| 10,871,514 B2 | 12/2020 | Lee et al. | |
| 2017/0328947 A1* | 11/2017 | Lee .................... | G01R 31/1263 |
| 2019/0011479 A1* | 1/2019 | Ota .................... | G01R 1/07335 |
| 2019/0250188 A1* | 8/2019 | Caudle ............... | G01R 31/2601 |
| 2020/0300909 A1 | 9/2020 | Couch et al. | |

OTHER PUBLICATIONS

English translation of Kobashi et al. JP 2001066345 "A Burn-In Board of Semiconductor IC" (Year: 2001).*

* cited by examiner

HIGH VOLTAGE INTEGRATED CIRCUIT TESTING INTERFACE ASSEMBLY

CROSS-REFERENCE TO RELATED APPLICATION

This application claims the benefit of and priority to U.S. Provisional Application No. 62/966,166, filed Jan. 27, 2020, which is hereby fully incorporated herein by reference."

BACKGROUND

The example embodiments relate to a high voltage (HV) testing interface assembly for integrated circuits (IC singular, ICs plural).

Certain ICs are tested in relatively high voltage environments, where for example testing voltages can be 1,000 to 10,000 VRMS or greater. Isolation ICs are a common example IC requiring HV testing. An isolation IC typically includes an internal electrical separation between areas inside the IC, which can be within a single or multiple IC package. The isolation prevents current flow between the isolated sections, but it often still permits transmission of an AC signal between the isolated sections. An isolation IC may be used for internal noise suppression or circuitry protection, or for safety purposes to prevent HV injury to someone near a device that includes the IC. Isolation ICs also may be used in various applications, including industrial, building and climate control, security systems, transportation, medical, telecommunications, and others.

IC isolation testing typically involves locating the IC adjacent a HV test board. Prior art test boards are typically fabricated from FR-4 (or FR4), which is a glass-reinforced epoxy laminate material, often used to construct printed circuit boards. Various layers are formed on the FR-4 test board, including the formation from an etched metal layer of a first test electrode and a second test electrode, both at the surface of the test board. For testing, the IC is aligned so that a first set of the IC pins mutually contact the first test electrode on the test board and, at the same time, a second set of the IC pins mutually contact the second test electrode on the test board. The IC layout may be designed to position the pins for such testing, for example with the first set of pins along a first side of the IC package and the second set of pins along a second side of the IC package, thereby providing easier alignment to the first and second test electrodes. Often some level of automated equipment aligns the IC (and its electrodes) to the testing board. Thereafter, a high voltage is applied between the first and second test electrodes, with the high voltage usually being a multiplier (e.g., 1.2 to 1.5) of the rated IC voltage performance. Finally, results of the applied voltage can be measured, observed, and/or recorded, to evaluate whether the IC internal barrier withstood the HV test. Failure detection evaluates whether a current flows between the first and second test electrode, as current flow thereby indicates an isolation breakdown.

While HV design testing is known as described above, test inaccuracies can occur. For example, during HV testing, a non-negligible charge (e.g., current flow) may be detected, presumably indicating an isolation failure. The detected charge, however, may be from design and test vulnerabilities, rather than an internal IC breakdown. One charge moving vulnerability may occur through air, which may include a partial discharge, usually measured in a range of Picocoulombs. Another charge moving vulnerability is a full arc, which usually measures much higher, for example in milliamps to Amps. Such charge moving vulnerabilities also may occur due to the test board design, for example due to the test electrode (or other conductor) proximity and/or geometry.

Some of the above considerations are also addressed in the following co-owned U.S. patent and U.S. patent application, both of which are fully incorporated herein by reference: (1) U.S. Pat. No. 10,871,514, issued Dec. 22, 2020; and (2) U.S. patent application Ser. No. 16/820,544, filed Mar. 16, 2020. Further, example embodiments are provided in this document that may improve on certain of the above concepts, as detailed below.

SUMMARY

In one example embodiment, there is an IC testing assembly. The IC testing assembly includes: (i) a first slug configured to contact a first surface of a first set of pins of an integrated circuit; (ii) a second slug configured to contact a second surface of the first set of pins of the integrated circuit; (iii) a third slug configured to contact a first surface of a second set of pins of the integrated circuit; and (iv) a fourth slug configured to contact a second surface of the second set of pins of the integrated circuit.

Other aspects and embodiments are also disclosed and claimed.

DETAILED DESCRIPTION

Figure 1:
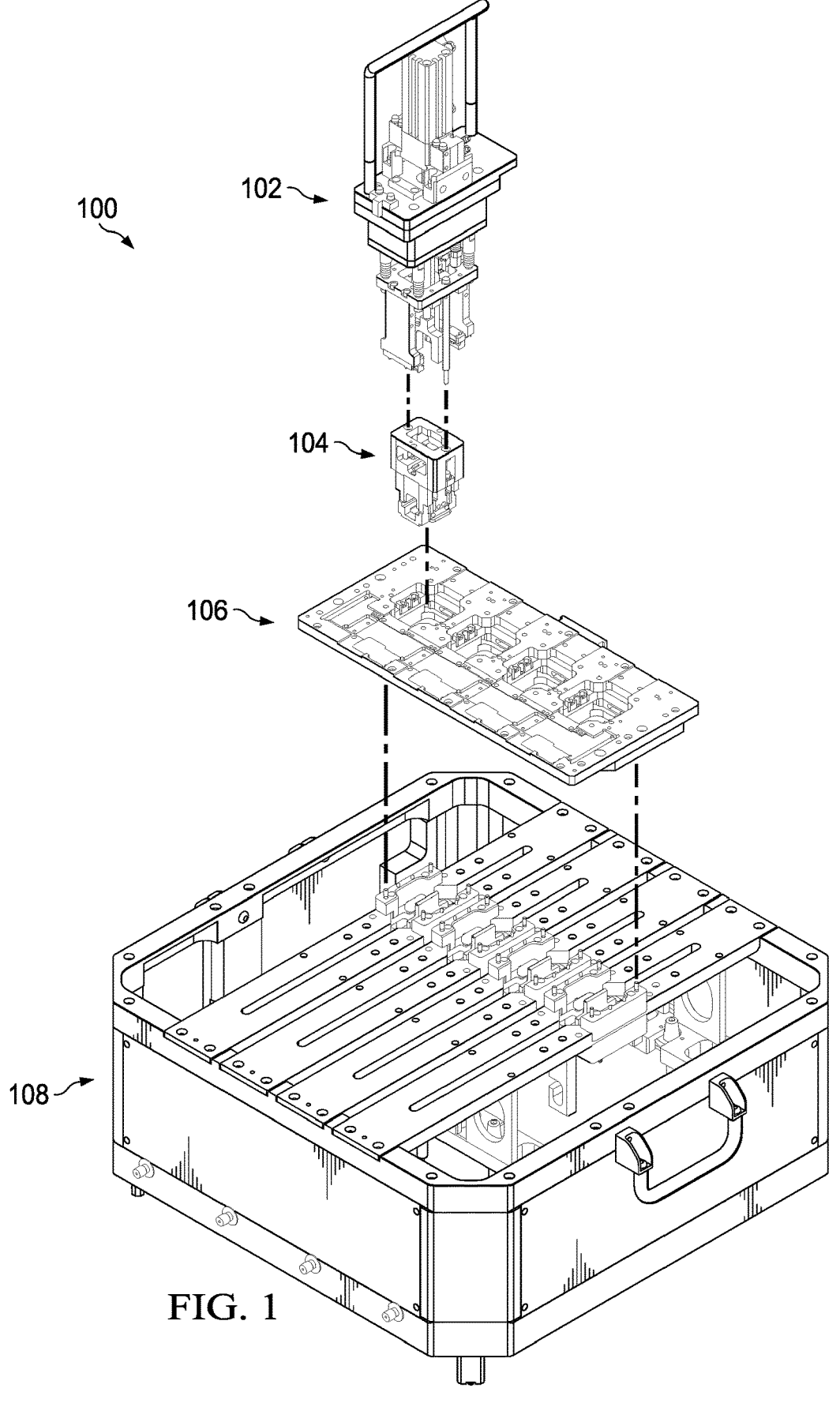
FIG. 1 illustrates a perspective exploded view of selected components in a HV IC testing interface system.

FIG. 1 illustrates a perspective exploded view of selected components in a HV IC testing interface system 100, oriented vertically for illustration but as can be mounted in different orientations in connection with additional apparatus. The HV IC testing interface system 100 includes a handler plunger 102, a plunger head 104, a socket plate 106, and a contactor assembly 108. The HV IC testing interface system 100 may include other structural and electrical aspects, including a cabinet, a processor, and mechanically cooperative structure, as are known in the art for housing and coordinating operation and movement of HV IC testing system components. For example, the handler plunger 102 may be situated within such a housing and the socket plate 106 (or multiple plates) mounted to apparatus also within the housing, where as demonstrated below the downward-illustrated end of the handler plunger 102 reciprocates back and forth, either plunging the plunger head 104 so that contact is made to, or retracting to withdraw contact from, the contactor assembly 108. More particularly and further detailed later, generally the HV IC testing interface system 100 receives an IC for testing, and the IC is commonly thus referred to as a device under test (DUT). The DUT may be gravity fed into the plunger head 104, although the DUT is not visible from the FIG. 1 view. Next, the handler plunger 102 advances the plunger head 104, and accordingly the retained DUT, through the socket plate 106, so that a conductive contact is achieved between the DUT leads and the contactor assembly 108, after which the DUT is HV tested through the achieved contact. Thereafter, the handler plunger 102 reverses the DUT directional movement to discontinue the DUT lead contact and to expel the DUT from the HV IC testing interface system 100. Next, a next DUT may be loaded into the plunger head 104 and the process repeats, so that the next DUT is likewise tested, and so forth. Additionally, FIG. 1 illustrates a single handler plunger 102 and single plunger head 104 for sake of simplifying the illustration. In actuality, the HV IC testing interface system 100 includes apparatus to move and test more than one DUT at a time. For example, the HV IC testing interface system 100 may test up to four DUTs at a time, each being concurrently moved to pass through a respective one of four passageways through the socket plate 106, with each DUT positioned on a respective test site of the contactor assembly 108. Accordingly, the various items described in this document, for example the handler plunger 102 and the plunger head 104, may be replicated to handle multiple DUTs at a time, with each DUT plunged to, and retracted away from, a respective test site of the contactor assembly 108. By way of example and for general frame of reference, dimensions of the above-introduced apparatus may be: (i) the handler plunger 102:120 mm (H) by 59 mm (W) by 286 mm (D); (ii) the plunger head 104:49 mm (H) by 32 mm (W) by 75 mm (D); and (iii) the contactor assembly 108:425 mm (H) by 425 mm (W) by 195 mm (D).

Figure 2A:
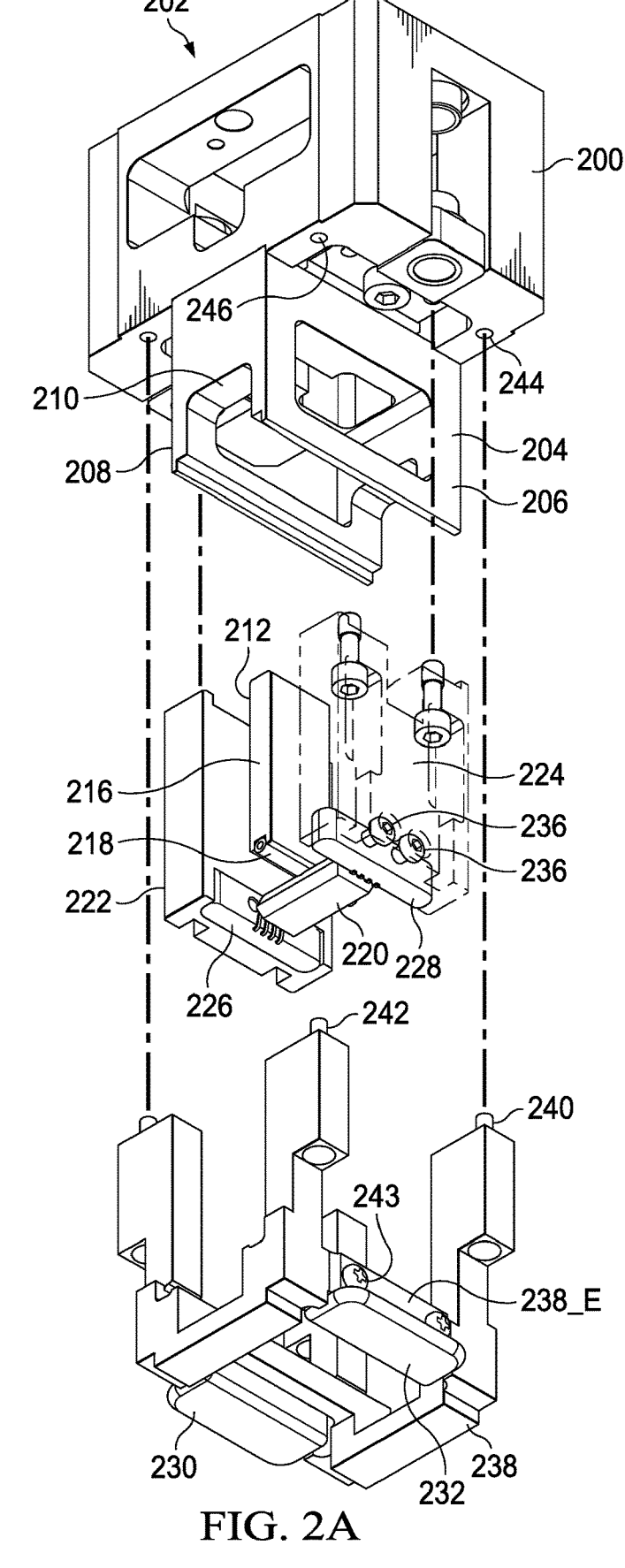
FIG. 2A illustrates a partial exploded and perspective view of the of the FIG. 1 plunger head.
Figure 2B:
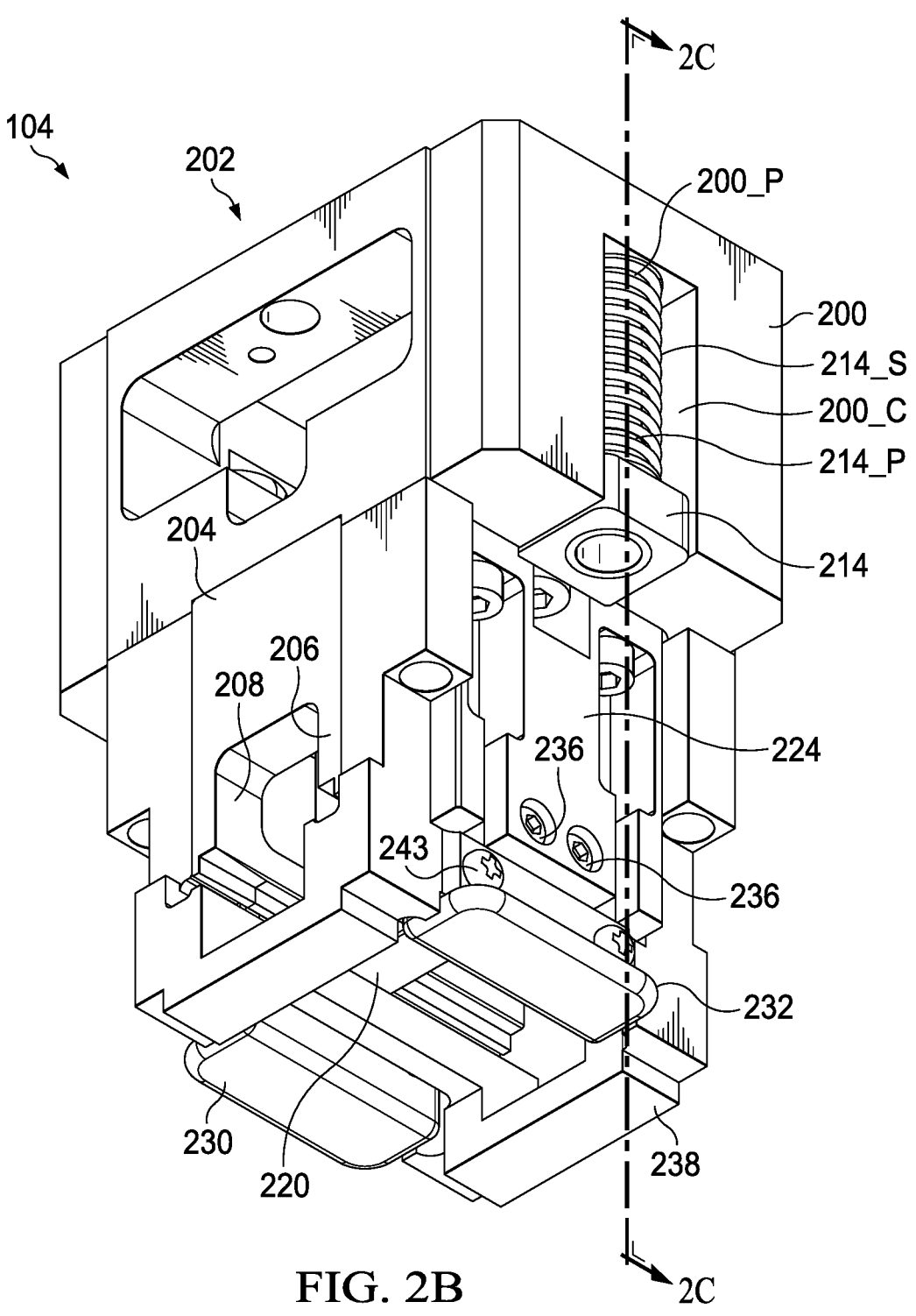
FIG. 2B illustrates an assembled and perspective view of the FIG. 1 plunger head.
Figure 2C:
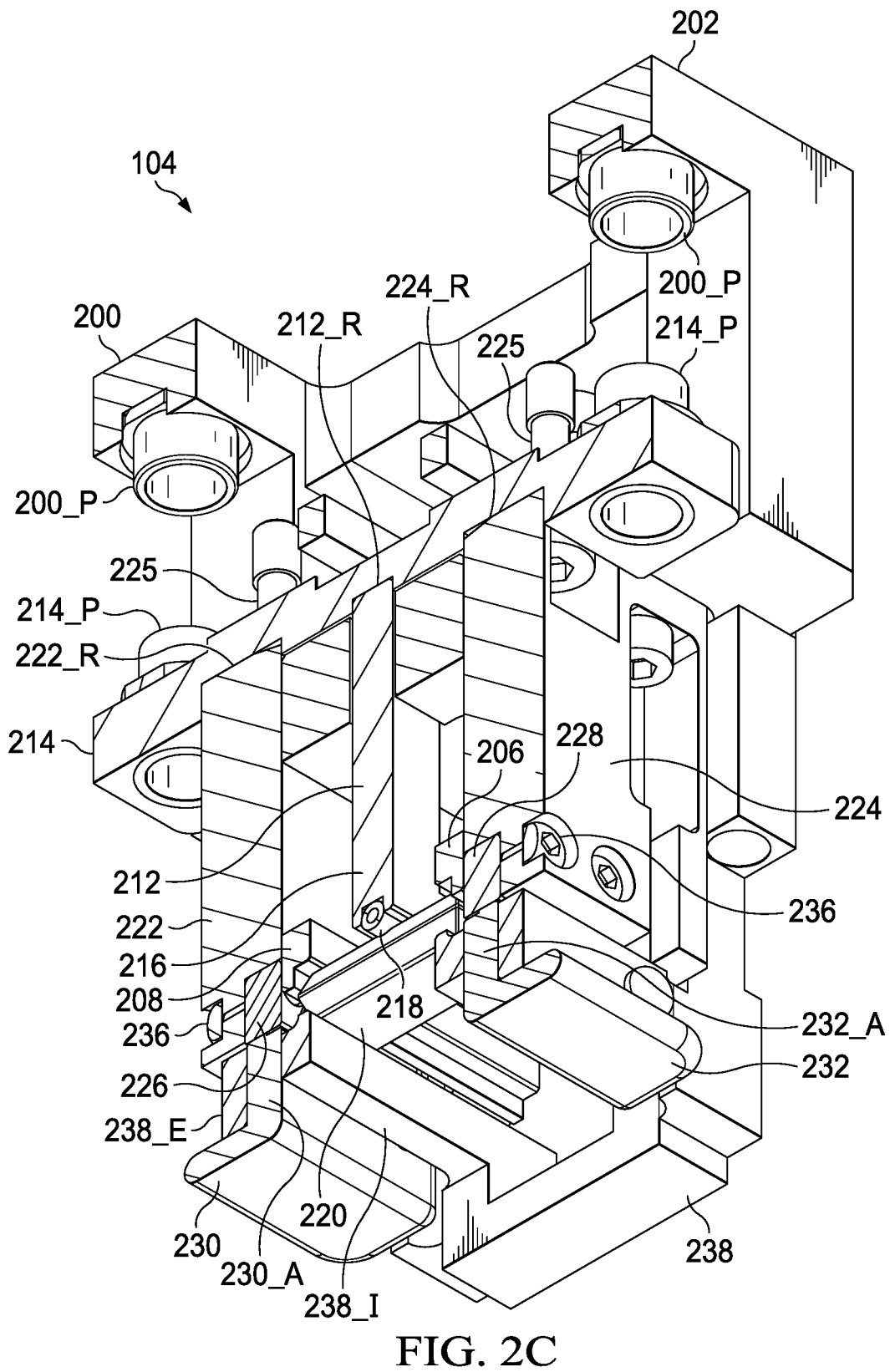
FIG. 2C illustrates a cross-sectional view of the FIG. 1 plunger head.
Figure 2D:
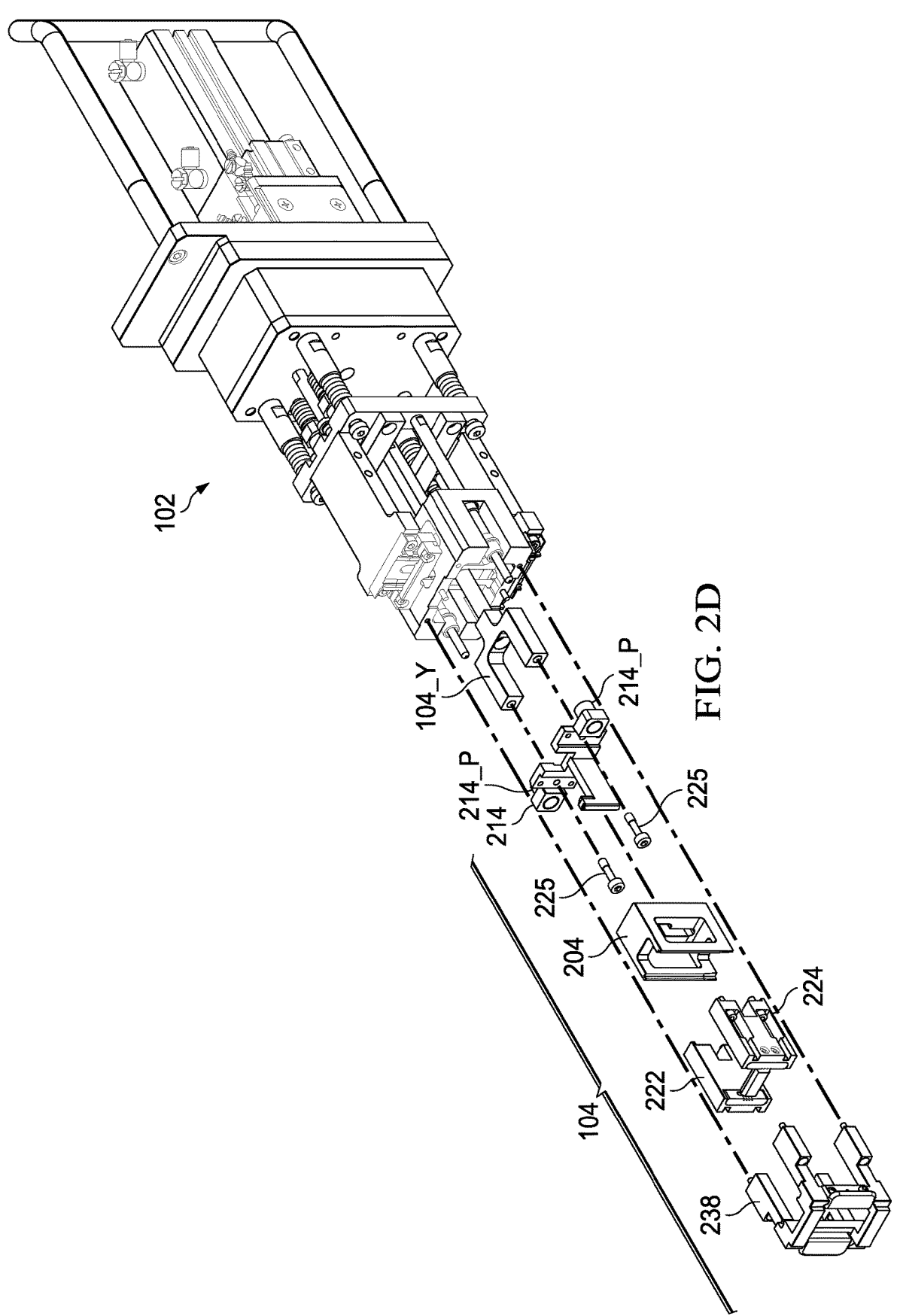
FIG. 2D illustrates an exploded view of portions of the FIG. 2C plunger head, in combination with a partial view of the FIG. 1 handler plunger.

FIG. 2A illustrates a partial exploded and perspective view, FIG. 2B illustrates an assembled and perspective view, and FIG. 2C illustrates a cross-sectional view, of the plunger head 104. FIG. 2D illustrates an exploded view of portions of the plunger head 104, in combination with a partial view of the handler plunger 102. The plunger head 104 includes a plunger base 200, for example constructed from stainless steel. The plunger head 104 includes structure and fitment so that on a first end 202 it may cooperate with the handler plunger 102 shown in FIG. 1, as further detailed below in FIGS. 5A and 5B.

Various apparatus extend away from the plunger base 200. For instance, a contact roof 204 is physically coupled to the plunger base 200, for example by friction fitting and/or screw attachment. In an example embodiment, the contract roof 204 is constructed from the dielectric polyether ether ketone (PEEK) 1000. The contact roof 204 has parallel members 206 and 208, extending in a direction away from the plunger base 200, with a cavity 210 between the parallel members 206 and 206. A top mold backer 212 is formed as a member affixed centrally within the cavity 210. The term "mold" is used herein due to its association with the molding material of a packaged IC or DUT. One end of the top mold backer 212 fits within a recess 212_R of a top frame 214 (FIG. 2C). The top mold backer 212 is generally parallel to the parallel members 206 and 208 and has a distal end 216 extending away from the contact roof 204. The distal end 216 includes a notch 212_N (see FIG. 4A), for example with a square and open-ended cross-section, in which is positioned a hollow upper tube 218 of a compliant material (e.g., silicone rubber), for eventually contacting a top side of a DUT 220 to be tested. The top frame 214, for example constructed from stainless steel, includes two posts 214_P, each supporting a respective spring 214_S, located in a cavity 200_C. Each spring 214_S provides an opposing force between the top of the top frame 214 and a respective one of the posts 200_P on the plunger base 200. Accordingly, absent another force, the springs 214_S force the top frame 214 away from an upper surface of the plunger base 200. As described later, however, the handler plunger 102 can pull the top frame 214, within the cavity 200_C, toward the underside of the plunger base 200. Outwardly from the parallel members 206 and 208 are respective top slug guide plates 222 and 224, respectively, each fitted within a respective recess 222_R and 224_R of the top frame 214. In an example embodiment, the top slug guide plates 222 and 224 are constructed from PEEK. A pair of screws 225 connect the top frame 214 to a Y-bar 104_Y of the handler plunger 102. Accordingly, and as further detailed later, as the Y-bar 104_Y extends, it likewise plunges the top frame 214 in a direction away from the handler plunger 102, where such plunging of the top frame 214 likewise plunges anything affixed relative to it, for example also plunging the top slug guide plates 222 and 224 and the top mold backer 112. In opposite directional fashion, when the Y-bar 104_Y retracts, it likewise retracts the top frame 214, and members affixed relative to it, toward the handler plunger 102.

Each of the top slug guide plates 222 and 224 abuts a respective top slug 226 and 228, whereas detailed later each of the top slugs 226 and 228 physically and electrically couples to a set of leads on the DUT 220, so as to compress those leads between the respective top slug 226 or 228 and a corresponding respective bottom slug 230 and 232 (see also, e.g., FIGS. 3A-3D). Each of the top slug guide plates 222 and 224 also includes additional structure to affix to the respective top slug 226 and 228. For example, such affix-ation structure may include a cooperative shape relationship, for example with the top slug 226 or 228 having a cross-sectional rectangular rounded corner profile and the respec-tive top slug guide plate have a similarly-shaped recess for mating with the top slug profile. Additionally, such affixation structure may include one or more apertures through which screws 236 are threadably affixed to attach a top slug guide plate 222 or 224 to its respective top slug 226 and 228. In an example embodiment, the screws 236 are made from a dielectric material, so as to reduce the effect on electrical fields during DUT testing.

The plunger head 104 also includes a bottom slug frame 238. The bottom slug frame 238 provides a physical align-ment of the bottom slugs 230 and 232 relative to the remainder of the plunger head 104 and, more immediately with respect to the underside of the leads on the DUT 220 (see, e.g., FIG. 3C). In an example embodiment, the bottom slug frame 238 has screws 240 and 242 that have tips that threaded into respective threaded holes 244 and 246 in the underside of the plunger base 200. The bottom slug frame 238 includes one or both of external and internal supports 238_E and 238_I that align with attachment wall portions 230_A and 232_A, of the bottom slugs 230 and 232, for physical affixation between the structures. Such affixation may include one or more apertures through which screws 243 are threadably affixed through a support 238_E, through an attachment wall portion 230_A (or 232_A), and to an internal support 238_I.

Figure 3A:
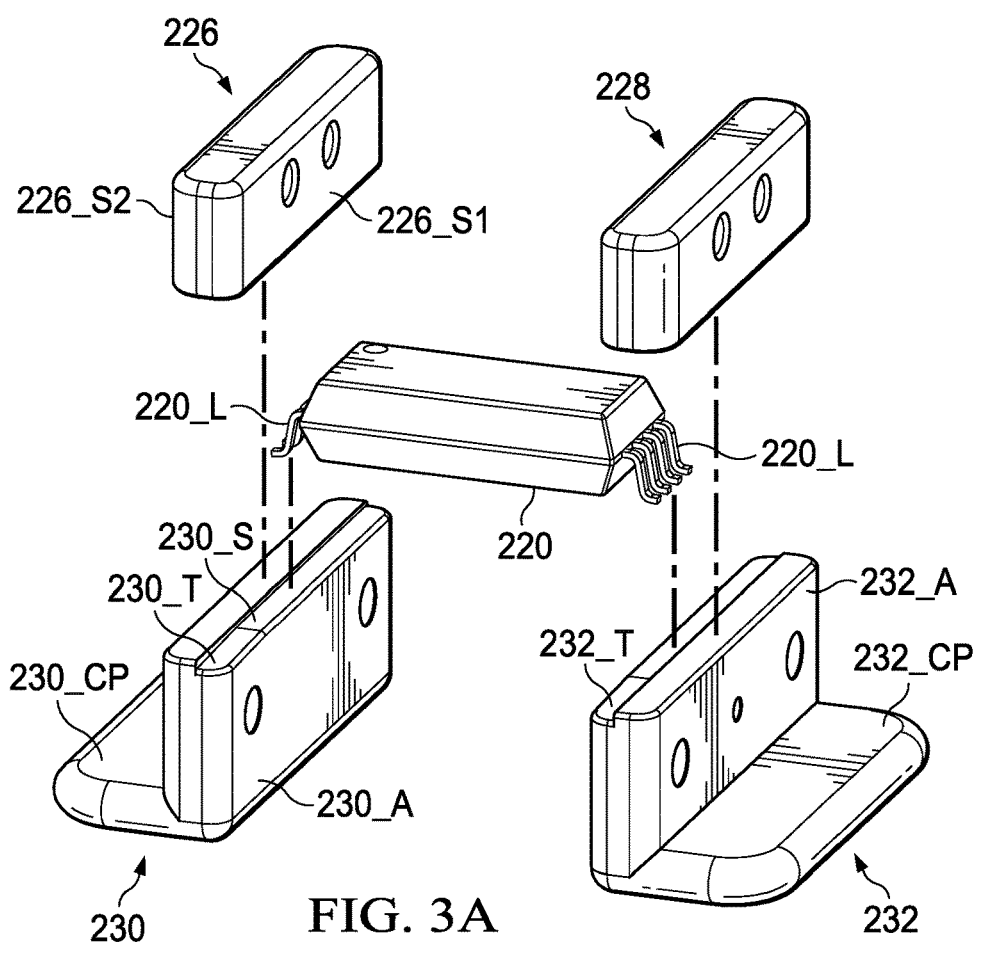
FIG. 3A illustrates a partial exploded and perspective view of slugs and the DUT in the FIG. 1 plunger head.
Figure 3B:
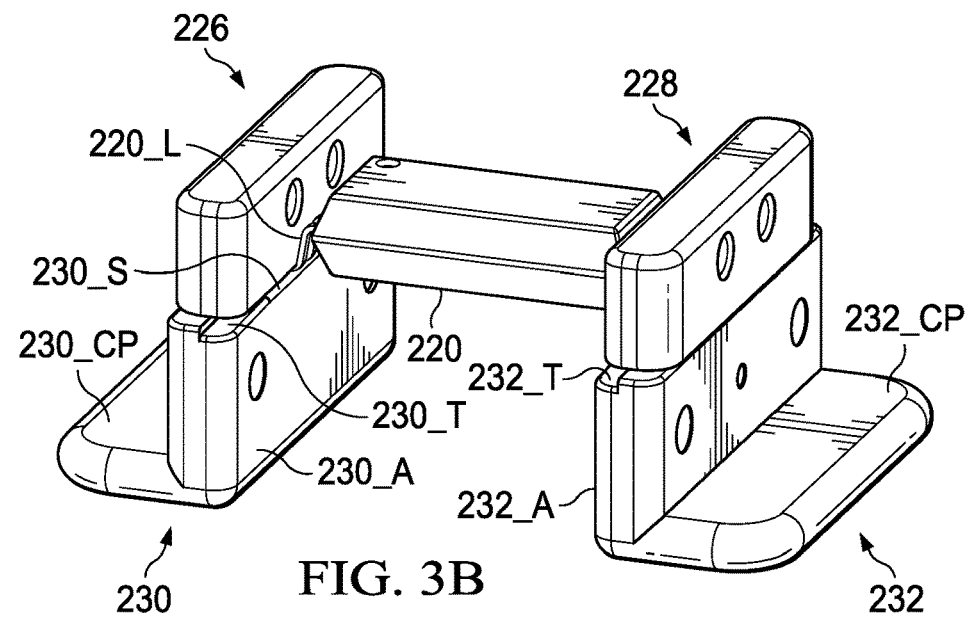
FIG. 3B illustrates an assembled and perspective view of slugs and the DUT in the FIG. 1 plunger head.
Figure 3C:
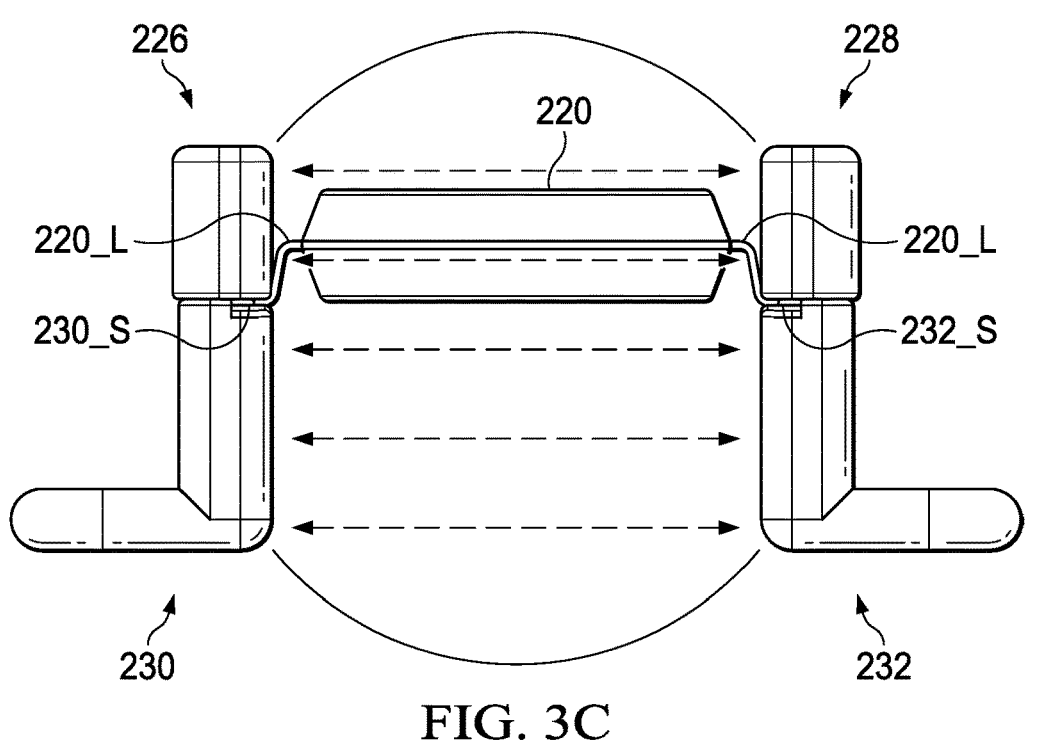
FIG. 3C illustrates a front view of slugs and the DUT in the FIG. 1 plunger head.
Figure 3D:
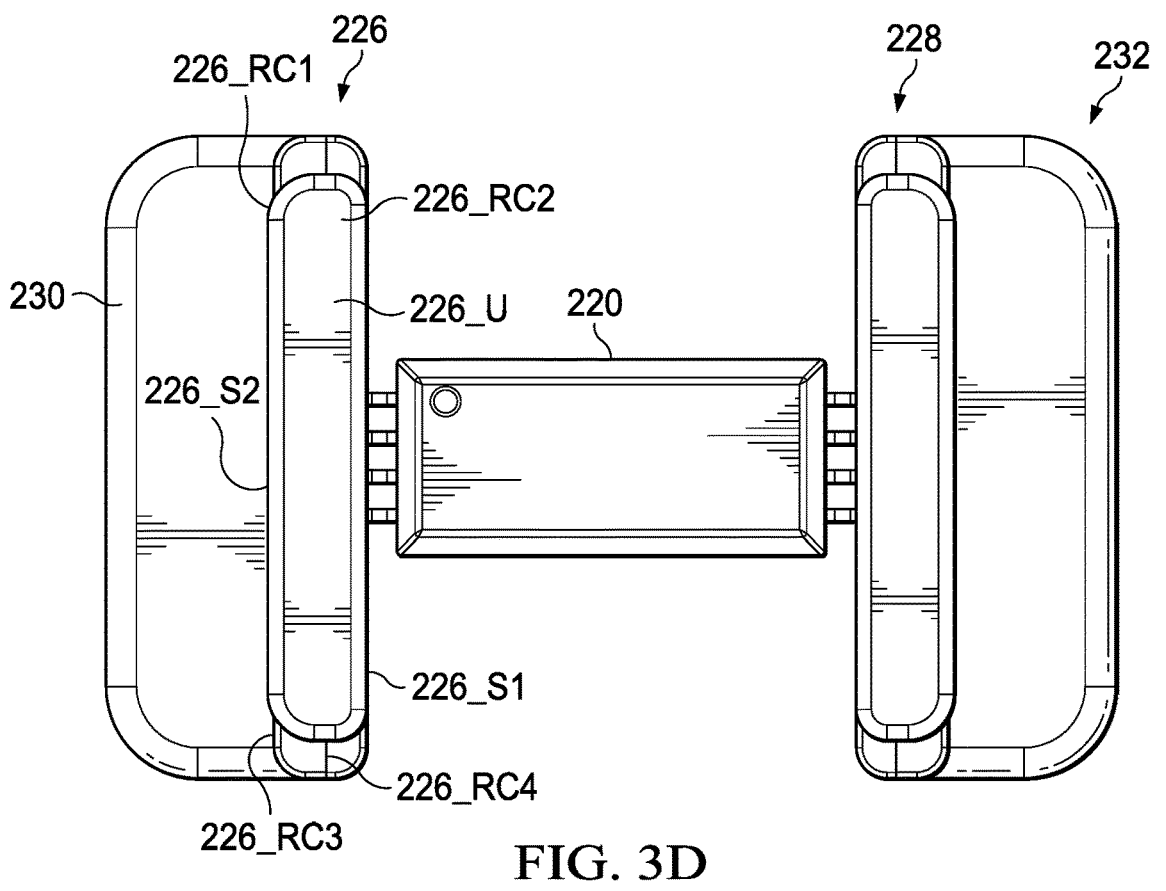
FIG. 3D illustrates a top view of the slugs and the DUT in the FIG. 1 plunger head.

FIG. 3A illustrates a partial exploded and perspective view, FIG. 3B illustrates an assembled and perspective view, FIG. 3C illustrates a front view, and FIG. 3D illustrates a top view of the DUT 220 in relation to the top slugs 226 and 228 and the bottom slugs 230 and 232. The FIGS. 3A-3D items are, as shown above, included in the plunger head 104. Accordingly, FIGS. 3A-3D, and the following discussion, provide additional details more readily appreciated from the enlarged and separated illustrations.

Generally, each of the top slugs 226 and 228 is a rounded rectangular member, that is, including a number of planar surfaces (top, bottom, ends, and sides), each interfacing with a respective rounded radial structure and with no disconti-nuity along the respective interface. Further, each of the top slugs 226 and 228 also is preferably processed to include as smooth as a surface as feasible (e.g., mirror finish), for example with post-machining polishing to remove any burrs and detectable edges. Thus, the interface between most or all planes has no sharp or distinct break in the physical surface continuity, creating smooth surface transitions so as to mitigate the possibility of higher electric fields (e.g., coro-nas) that could occur at such discontinuities. For example, with respect to the top slug 226, it includes an upper surface 226_U with four rounded corners 226_RC1, 226_RC2, 226_RC3, and 226_RC4, each with a same radius relative to the upper surface 226_U, and also with a same radius relative to both side surfaces 226_S1 and 226_S2 of the top slug 226. Also for each of the top slugs 226 and 228, the lower surface also has a common radius as between the surface and its corners, and as between the surface and the perpendicular sides.

Generally each of the bottom slugs 230 and 232 has two members that are perpendicular to one another, an attach-ment portion 230_A and 232_A that is coplanar with the respective upper slugs 226 and 228, and an outwardly extending contact portion 230_CP and 232_CP. In an example embodiment, for at least each surface that faces the DUT 220, when the slugs are physically (and electrically) coupled to the DUT leads, those surfaces are also rounded rectangular surfaces. Accordingly as shown in FIG. 3C by dashed arrows, the electrical field in the vicinity of the DUT 220 and the various slugs 226, 228, 230, 232, should be relatively uniform, so as to reduce the possibility of arcs or the like. In addition, the upper inward-facing corner of each of the attachment portion 230_A and 232_A is stair-stepped with a shelf 230_S and 232_S, so that leads 220_L of the DUT are received along each of the shelf 230_S and 232_S when the parts are coupled, as visible in the perspective of FIGS. 3B and 3C. Further, one end of each of shelf 230_S and 232_S has a respective chamfer 230_T and a chamfer 232_T, that is, a downward tilting portion, so as to facilitate loading and unloading of the DUT 220 leads 220L against the respective shelf.

Figure 4A:
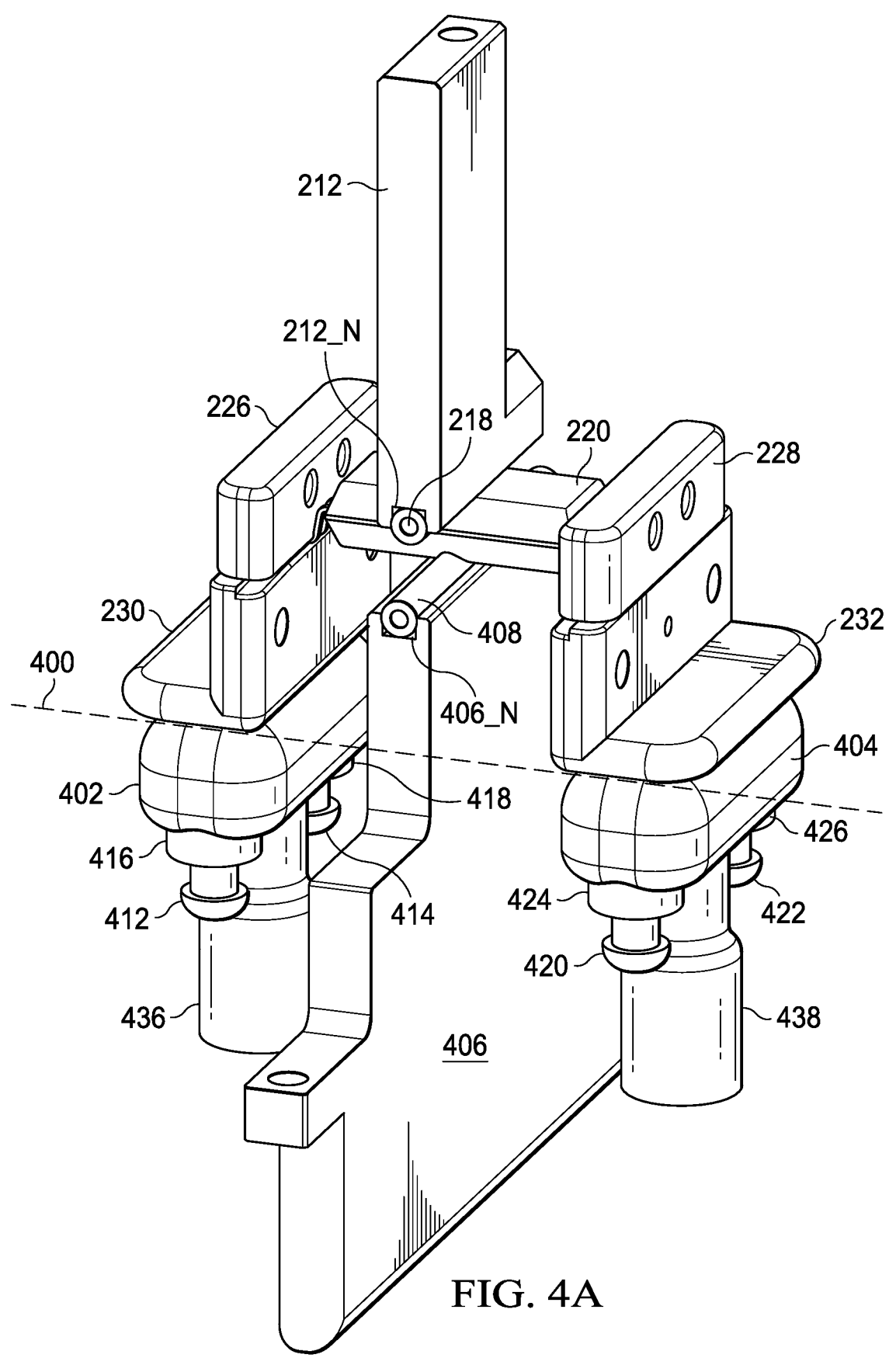
FIG. 4A illustrates a perspective view of selected FIG. 1 plunger head and contactor assembly items.
Figure 4D:
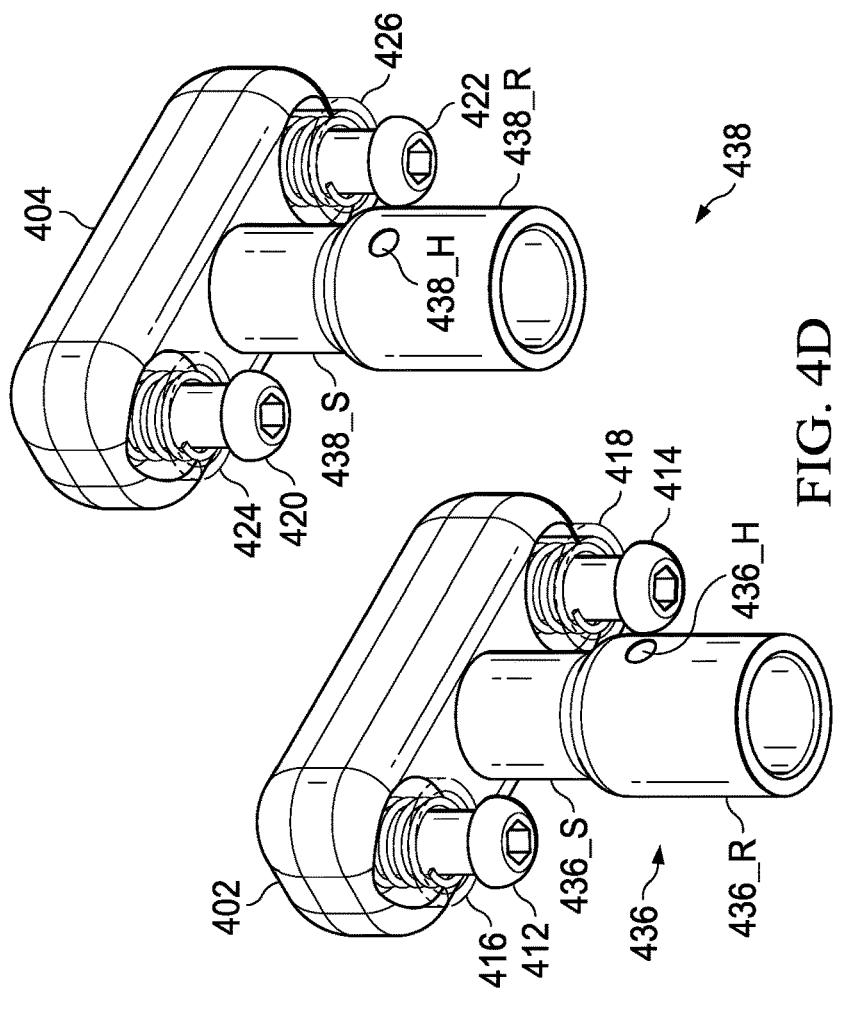
FIG. 4D illustrates a perspective lower view of selected FIG. 4A items.
Figure 4B:
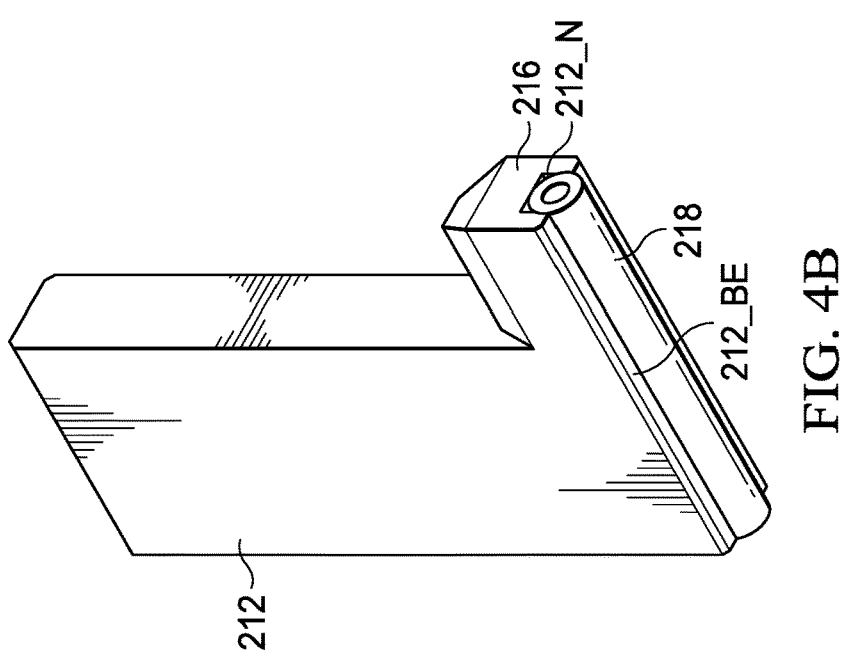
FIG. 4B illustrates a side perspective view of the FIG. 4A top mold backer.
Figure 4C:
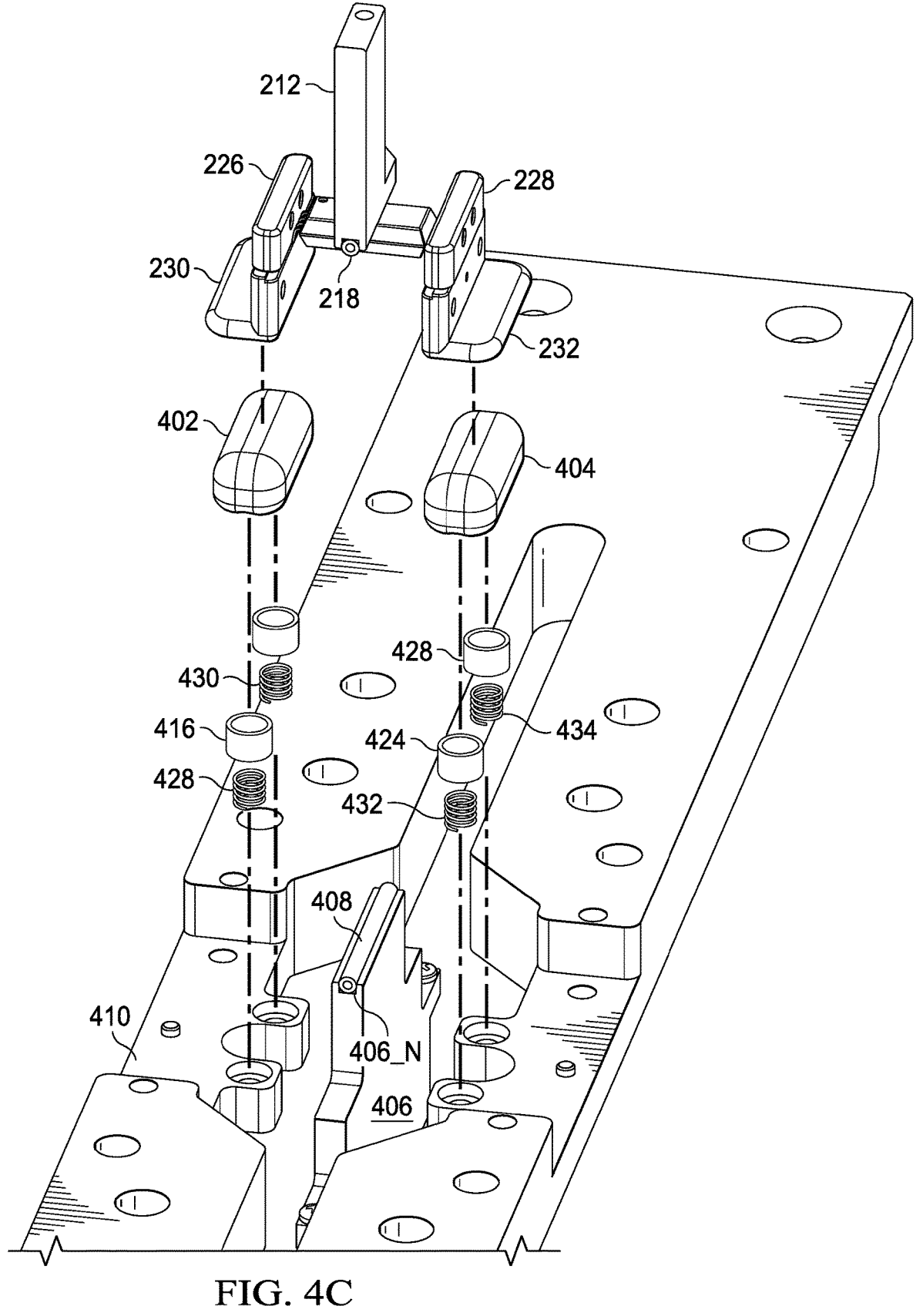
FIG. 4C illustrates a partially exploded perspective view including the FIG. 4A items.

FIG. 4A illustrates a perspective view of selected plunger head 104 items above a dashed line 400, while below the dashed line 400 are additional items from the FIG. 1 contactor assembly 108. FIG. 4B also illustrates a side perspective view of the FIG. 4A top mold backer 212. FIG. 4C illustrates a partially exploded perspective view includ-ing the FIG. 4A items. FIG. 4D illustrates a perspective lower view of selected FIG. 4A items.

Above the FIG. 4A dashed line 400 are the items shown in FIGS. 3A-3C, along with the top mold backer 212. The FIG. 4B perspective illustrates that the top mold backer distal end 216, and the notch 212_N, pass along a majority, or all, of a bottom edge 212_BE of the top mold backer 212. Further, the hollow upper tube 218 is positioned within the notch 212_N, so that approximately 180 degrees or more of the outer cross-sectional circumference of the hollow upper tube 218 fits within the notch 212_N, while the remainder protrudes away from the top mold backer 212. As shown in FIG. 4A, therefore, a portion of that protruding remainder of the hollow upper tube 218 may contact the top surface of the DUT 220, when the top mold backer 212 is advanced into the FIG. 4A illustrated position, as further detailed later.

Below the FIG. 4A dashed line 400 are additional items that provide an electrical and structural coupling for HV testing of the DUT 220, as also shown in FIGS. 4C and 4D. Certain of these items are analogous and further modified with respect to items shown in the above-incorporated U.S. patent application Ser. No. 16/820,544, including a first electrode 402 and a second electrode 404, and a vertical charge separation wall 406 between the first electrode 402 and a second electrode 404. Once the handler plunger 102 positions the FIG. 4A items as shown in that figure, the lower surface of the bottom slug 230 both physically and electrically contacts an upper surface of the first electrode 402, and the lower surface of the bottom slug 232 both physically and electrically contacts an upper surface of the second electrode 404. With such contact, each of the first and second electrodes 402 and 404 may receive a different voltage, which is therefore coupled to and across the DUT 220. Additionally, the vertical charge separation wall 406 provides field isolation between the first electrode 402 and the second electrode 404, for example by lengthening the distance a charge has to flow though to create an arc in the high electric field region between the first and second electrodes 402 and 404. Additionally, the vertical charge separation wall 406 includes a notch 406_N, for example with a square and open-ended cross-section, in which is positioned a hollow lower tube 408 of a compliant material (e.g., silicone rubber), for eventually contacting a bottom side of the DUT 220 when the DUT 220 is plunged toward the hollow lower tube 408 by the handler plunger 102. Each of the first and second electrodes 402 and 404 has at least an inward facing (toward the vertical charge separation wall 406) surface with no discontinuities, as also detailed in patent application Ser. No. 16/820,544, to reduce the possibility of electrical field vulnerabilities that can cause coronas or arcs during HV testing.

Figure 5A:
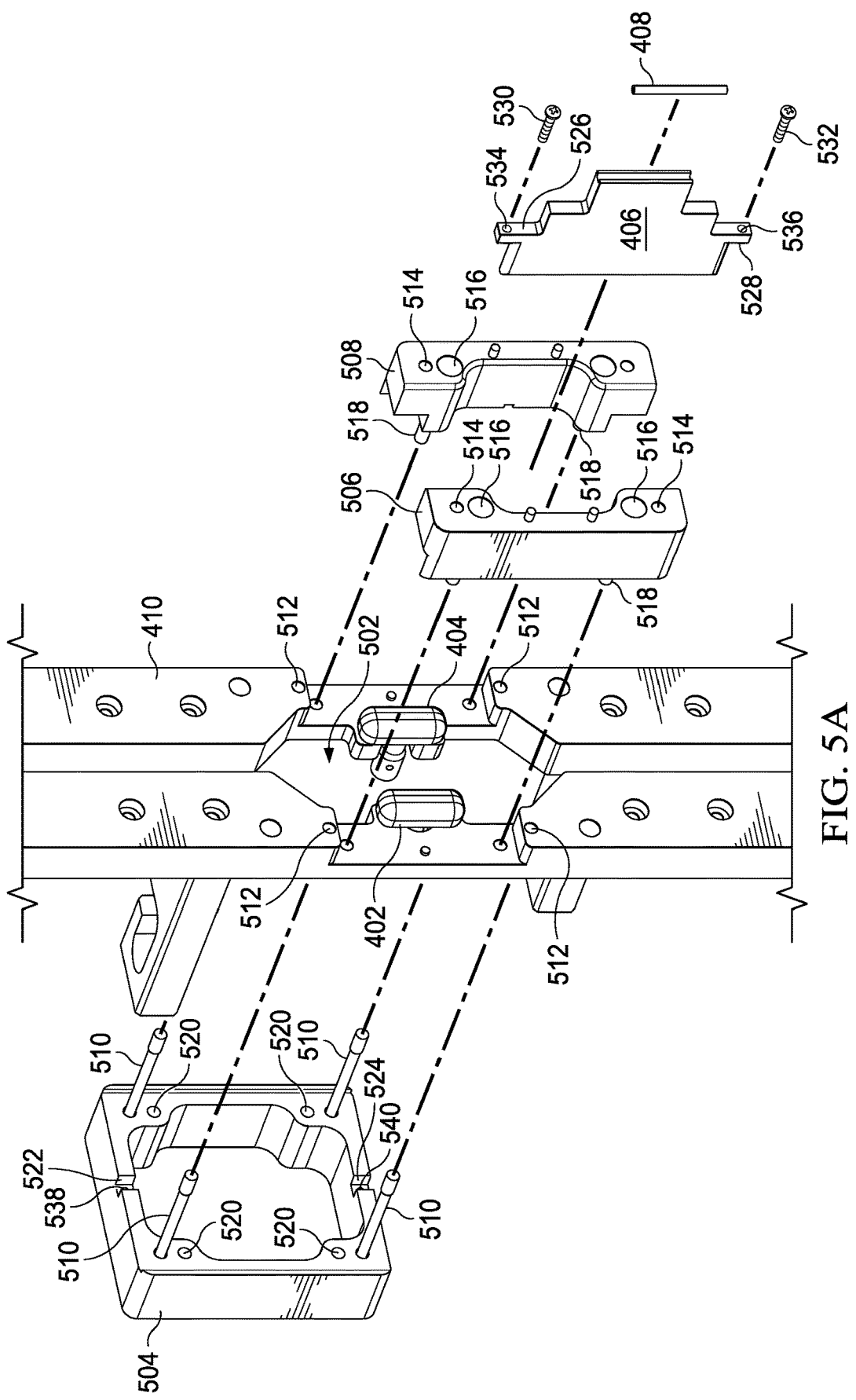
FIG. 5A illustrates a top perspective partially exploded view of selected contactor assembly items.
Figure 5B:
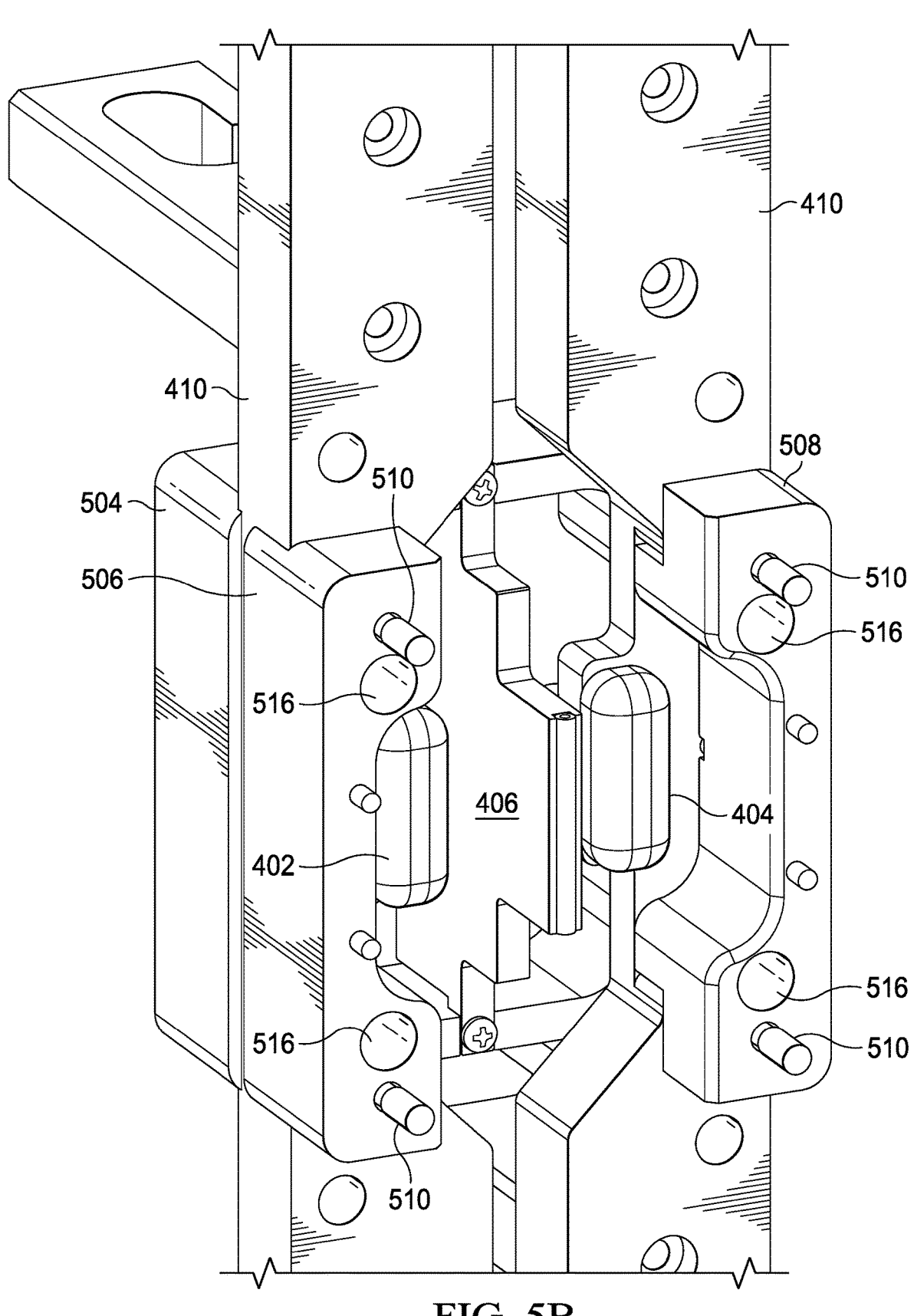
FIG. 5B illustrates the FIG. 5A items affixed relative to a slab.
Figure 5C:
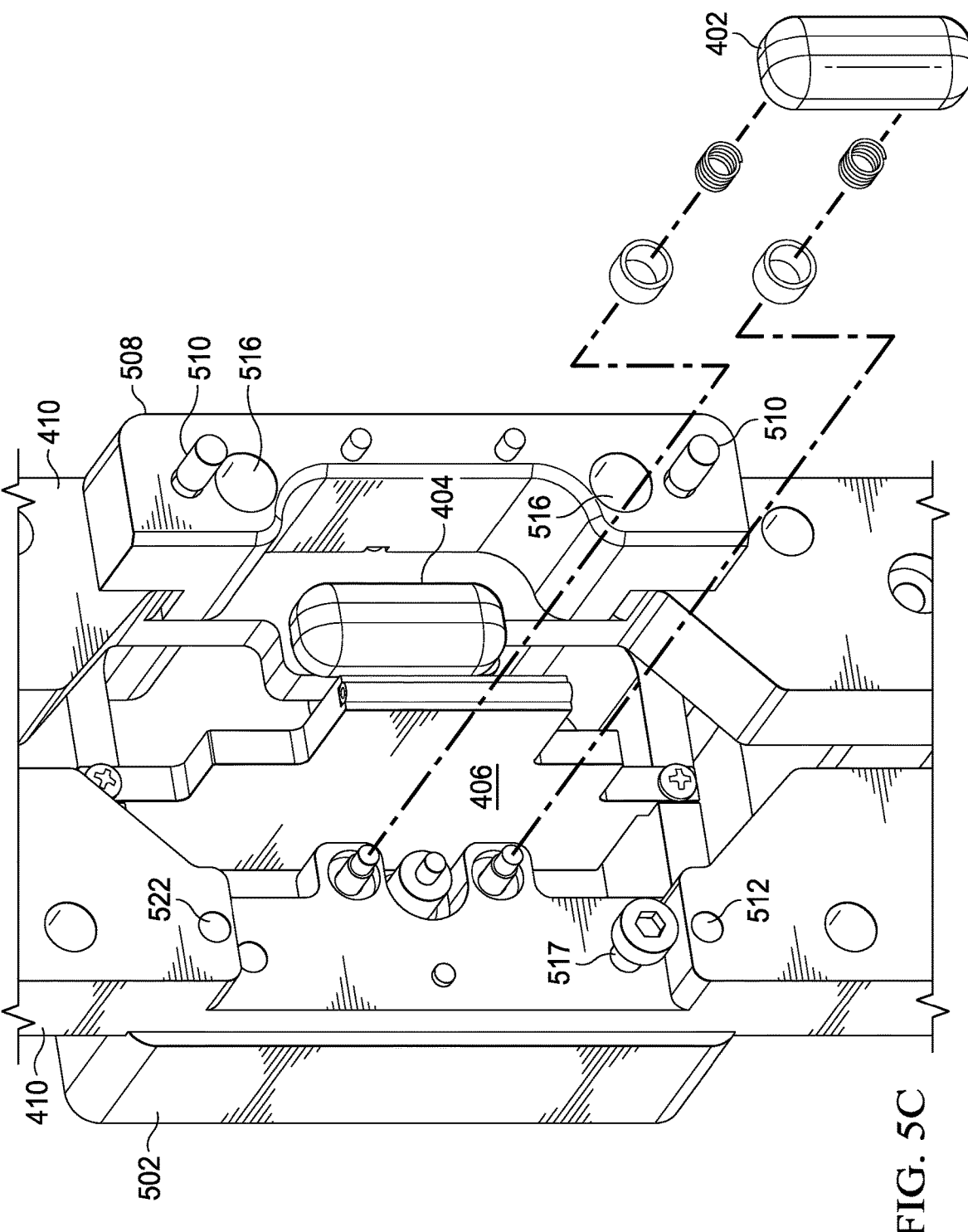
FIG. 5C illustrates FIG. 5B in partially exploded view.
Figure 5D:
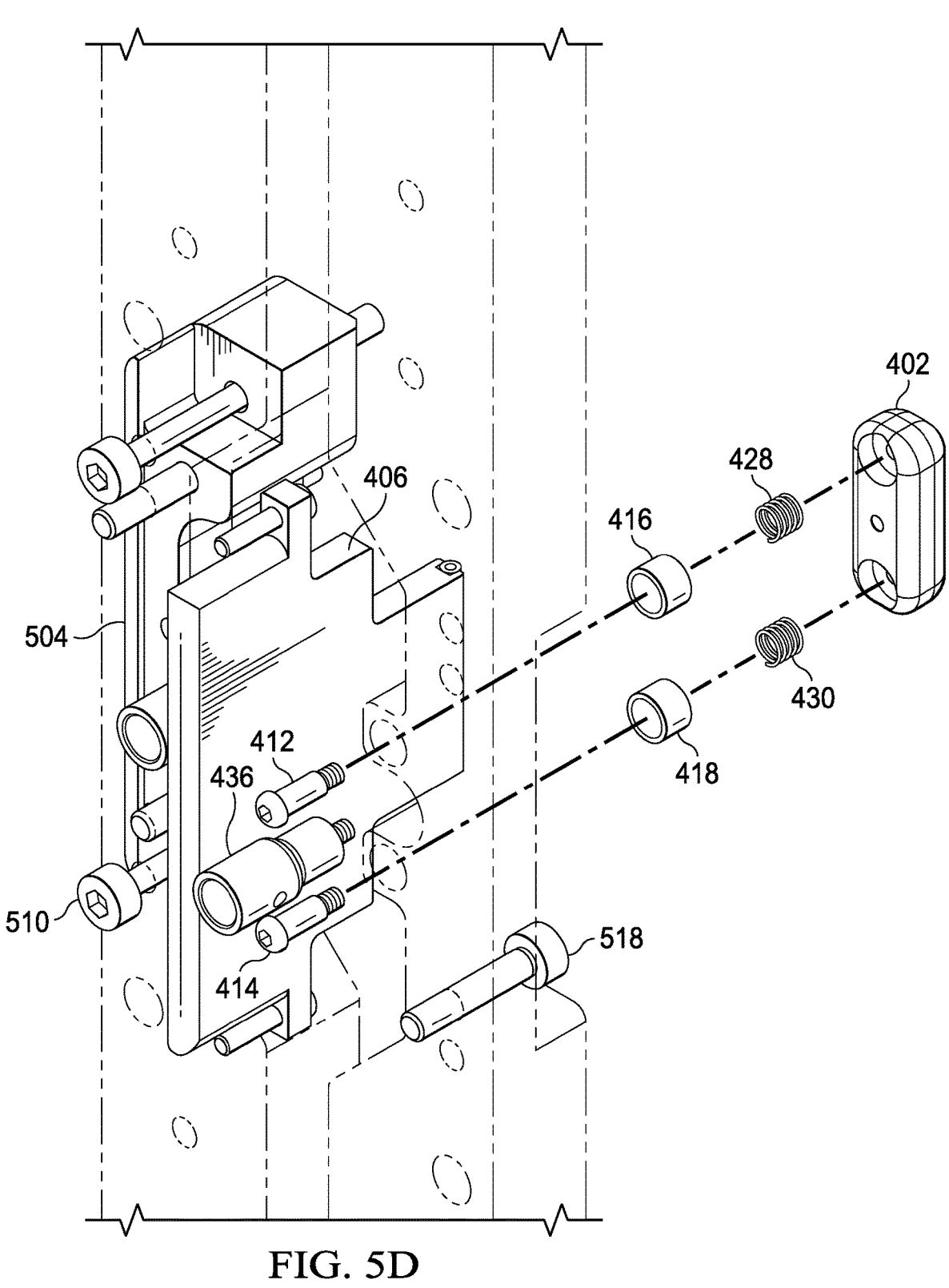
FIG. 5D illustrates a bottom perspective partial and partially exploded view of FIG. 5C.
Figure 5E:
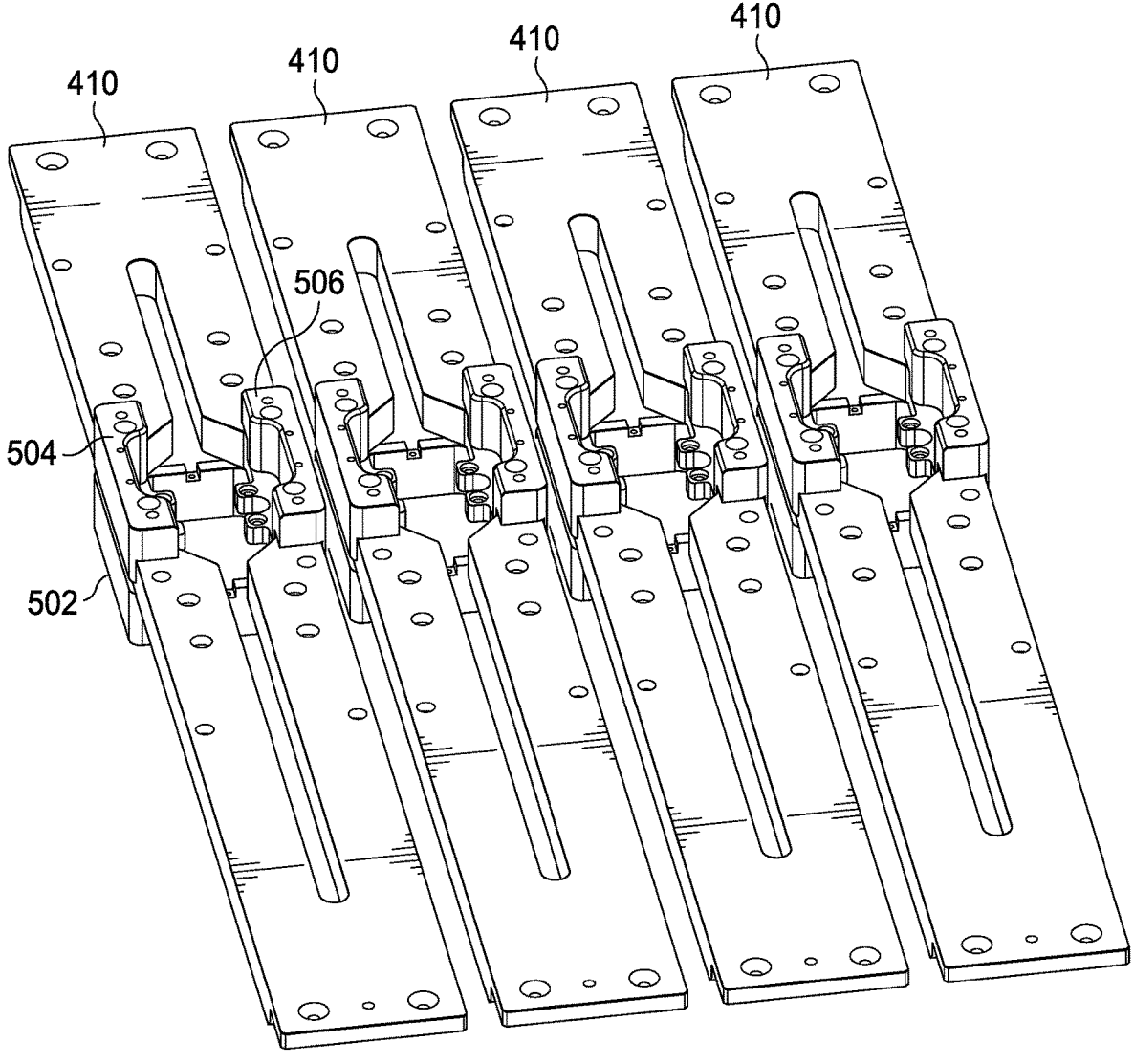
FIG. 5E illustrates a perspective assembled view of some items in connection with multiple slabs.

Each of the first electrode 402 and the second electrode 404 is physically coupled to a slab 410, where FIG. 4C illustrates only a portion of the left and right sides of one single slab 410 (see, larger view of the slab 410 in FIG. 5E, illustrating four different slabs, each with a respective HV IC testing site, where as shown in FIGS. 5A, 5B, and 5C, each testing site includes a first electrode 402 and second electrode 404). The physical couplings for the first electrode 402 include a first screw 412 and a second screw 414, where the underside of each screw head abuts one side of the slab 410, its shank passes through a respective metal sleeve 416 and 418, and its tip threads into a threaded hole in a lower surface portion of the first electrode 402. Similarly, the physical couplings for the second electrode 404 include a first screw 420 and a second screw 422, where the underside of each screw head abuts one side of the slab 410, its shank passes through a respective metal sleeve 424 and 426, and its tip threads into a threaded hole in a lower surface portion of the second electrode 404. In an example embodiment, each of the screws 412, 414, 420, and 422 is constructed from stainless steel. Inside each of the metal sleeves 416, 418, 424, and 426 is a respective spring 428, 430, 432, and 434, where the lower portion of each spring 428, 430, 432, and 434 fits within a recess in the slab 410 and the upper portion of each spring 428, 430, 432, and 434 biases against the lower surface of a respective one of the first electrode 402 or second electrode 404. In this manner, and with a small gap in the height of each sleeve relative to the spring it encircles and the recess in which each spring is seated, the first electrode 402 and the second electrode 404 are spring biased in one direction (upward in the perspective of FIG. 4C) to provide some compression in the opposite direction when the bottom slugs 230 and 232 are plunged into contact with the first and second electrodes 402 and 404. Additionally, the sleeves corresponding to the HV of the two electrodes 402 and 404 avoids the direct e-field coupling between the springs of that one HV electrode to the_LV metals of the opposing one of the electrodes.

Each of the first electrode 402 and the second electrode 404 also has a respective wire retaining member 436 and 438 physically and electrically coupled to the lower surface portion of the respective electrode (e.g., by press fit or threadable fitment). Shown in FIG. 4D, the wire retaining member 436 includes a stem 436_S, for example a solid cylinder, coupled in co-axial alignment to a receptacle 436_R, that includes a partially hollow cylinder with one end open to receive a sheathed wire. The interior of the wire retaining member 436 may include a counterbore so as to receive a wire (not shown) protruding from a sheath, where the protruding wire extends to or beyond a threaded hole 436_H in which a screw may be tightened to affix the screw tip to or through the wire, thereby retaining the wire in the wire retaining member 436. In this regard, an electrical signal (e.g., voltage) can be passed via the wire into the entire conductive body of the first electrode 402. Similar attributes are shown and labeled for the second electrode 404.

Figure 5F:
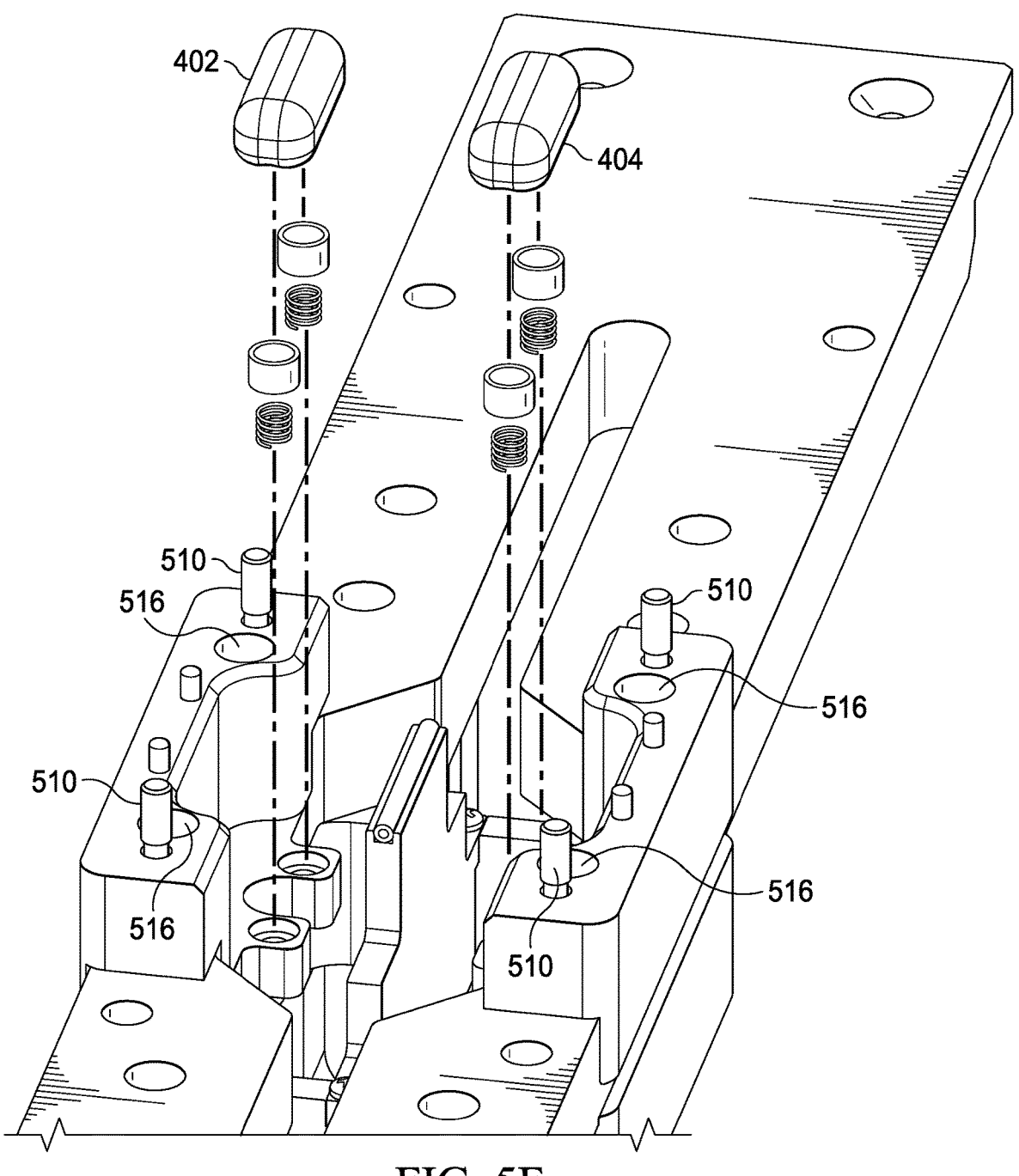
FIG. 5F illustrates a front perspective and partially exploded view of FIG. 5A.
Figure 5G:
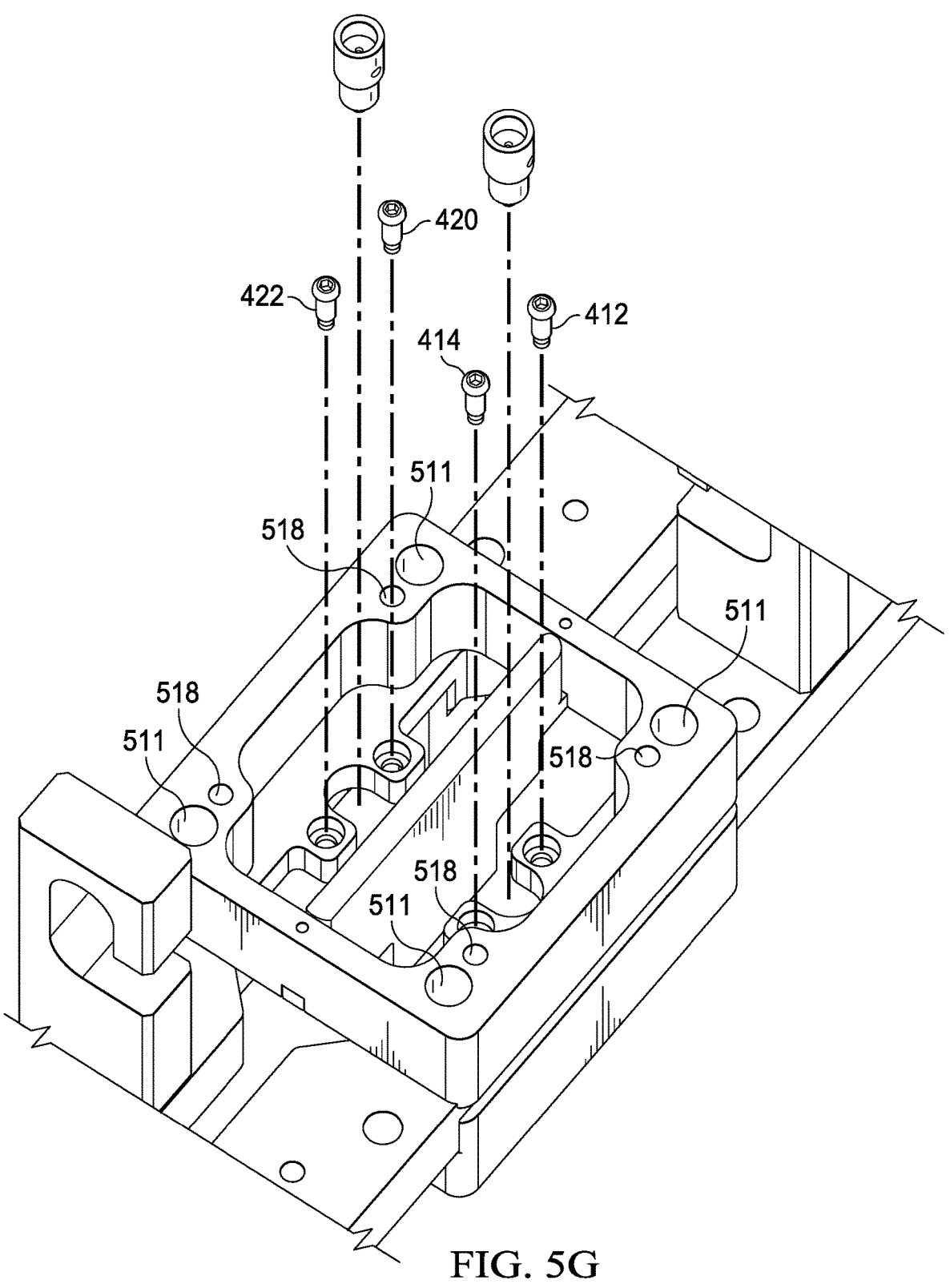
FIG. 5G illustrates a bottom perspective view of FIG. 5B.

FIG. 5A illustrates a top left perspective partially exploded view of selected items, and FIG. 5B illustrates those items affixed, relative to the slab 410. FIG. 5C illustrates FIG. 5B in partially exploded view with a portion removed to illustrate various aspects. FIG. 5D illustrates a bottom perspective partial and partially exploded view. FIG. 5E illustrates a perspective assembled view of some items in connection with multiple slabs 410. FIG. 5F illustrates a front perspective and partially exploded view of FIG. 5A. FIG. 5G illustrates a bottom perspective view of FIG. 5B.

In an example embodiment, each HV IC testing site is positioned relative to a longitudinal aperture 502 along the major axis of the slab 410. An area of the longitudinal aperture 502 is fully surrounded on one side (to the left in FIG. 5A, for example the underside) of the slab 410 by a lower insulating wall surround 504, and a majority of an area of the longitudinal aperture 502 is surrounded on an opposing side (to the right in FIG. 5A, for example the upper side) of the slab 410 by a first and second upper insulating wall surround portion 506 and 508. In an example embodiment, each of the lower insulating wall surround 504 and the first and second upper insulating wall surround portions 506 and 508 is formed from a dielectric material, such as Polyetherimide (PEI). Further, each of these items includes or cooperates with various structure to fit and attach relative to one another and to the slab 410. For example, the lower insulating wall surround 504 has a plurality of screws 510, with each screw 510 countersunk into a respective counterbore 511 in the upper surface of the lower insulating wall surround 504. The shank of each of the screws 510 extends in the direction of, and fits through a respective aperture 512, in the slab 410, so that the threaded end of each screw 510 cooperates with a respective threaded aperture 514 in either of the first and second upper insulating wall surround portions 506 and 508. Further, each of the first and second upper insulating wall surround portions 506 and 508 has an upper surface pair of counterbore apertures 516, where a respective screw 518 may be fitted so that the screw shank passes through the upper insulating wall surround portion, through the slab 410, and the threaded screw tip threads into a respective threaded hole 520 in the lower insulating wall surround 504._Lastly, the lower insulating wall surround 504 includes a pair of notches 522 and 524, each for physically receiving a respective complementary shaped tab 526 and 528 of the vertical charge separation wall 406. Further, this fitment may be augmented by attachment screws 530 and 532, each having a shank passing through a respective hole 534 and 536 in the tabs 526 and 528, the screw further having a tip threadably fitting into a respective threaded hole 538 and 540 in the respective notches 522 and 524.

Figure 6A:
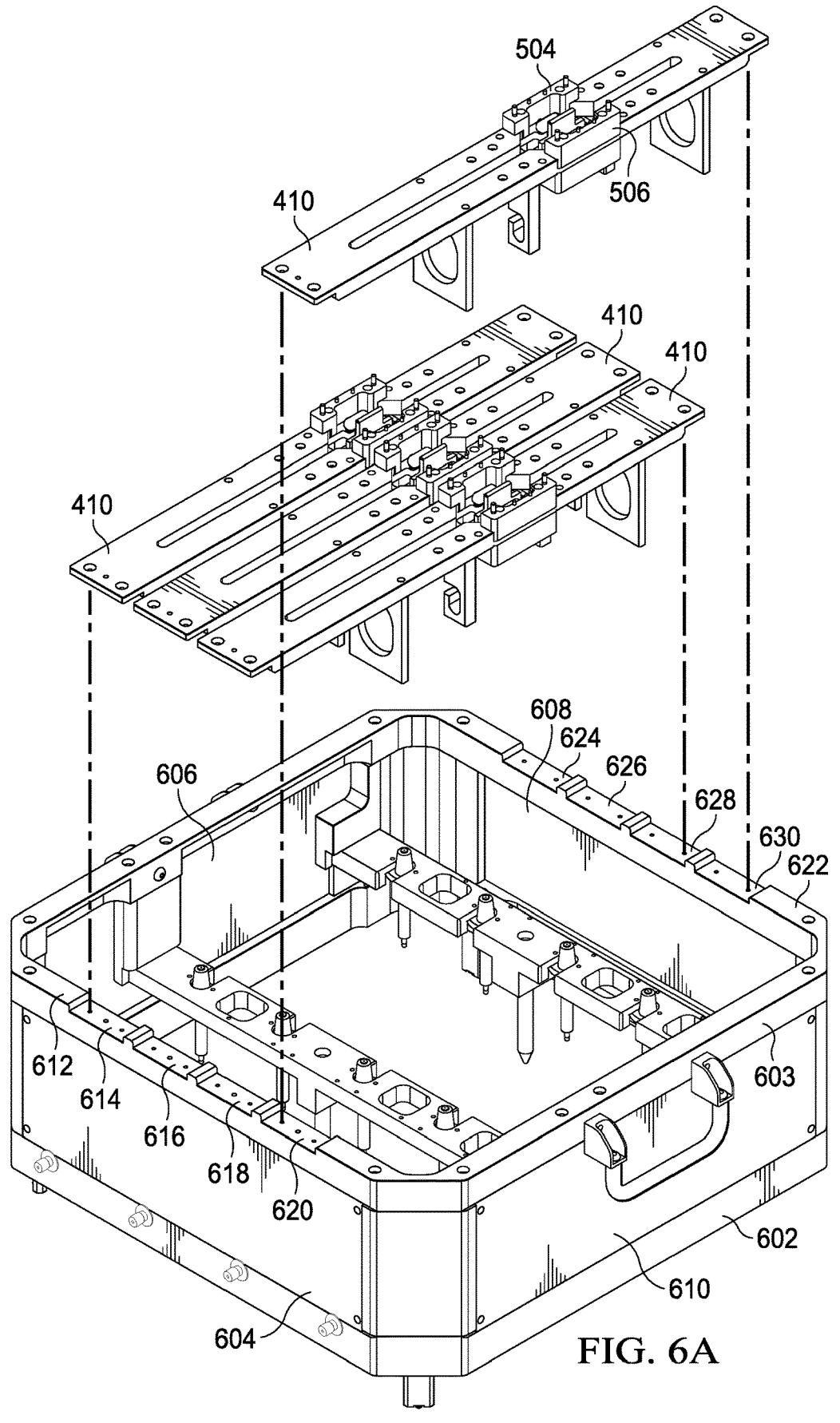
FIG. 6A illustrates a partial exploded perspective views of the contactor assembly and selected slabs.
Figure 6B:
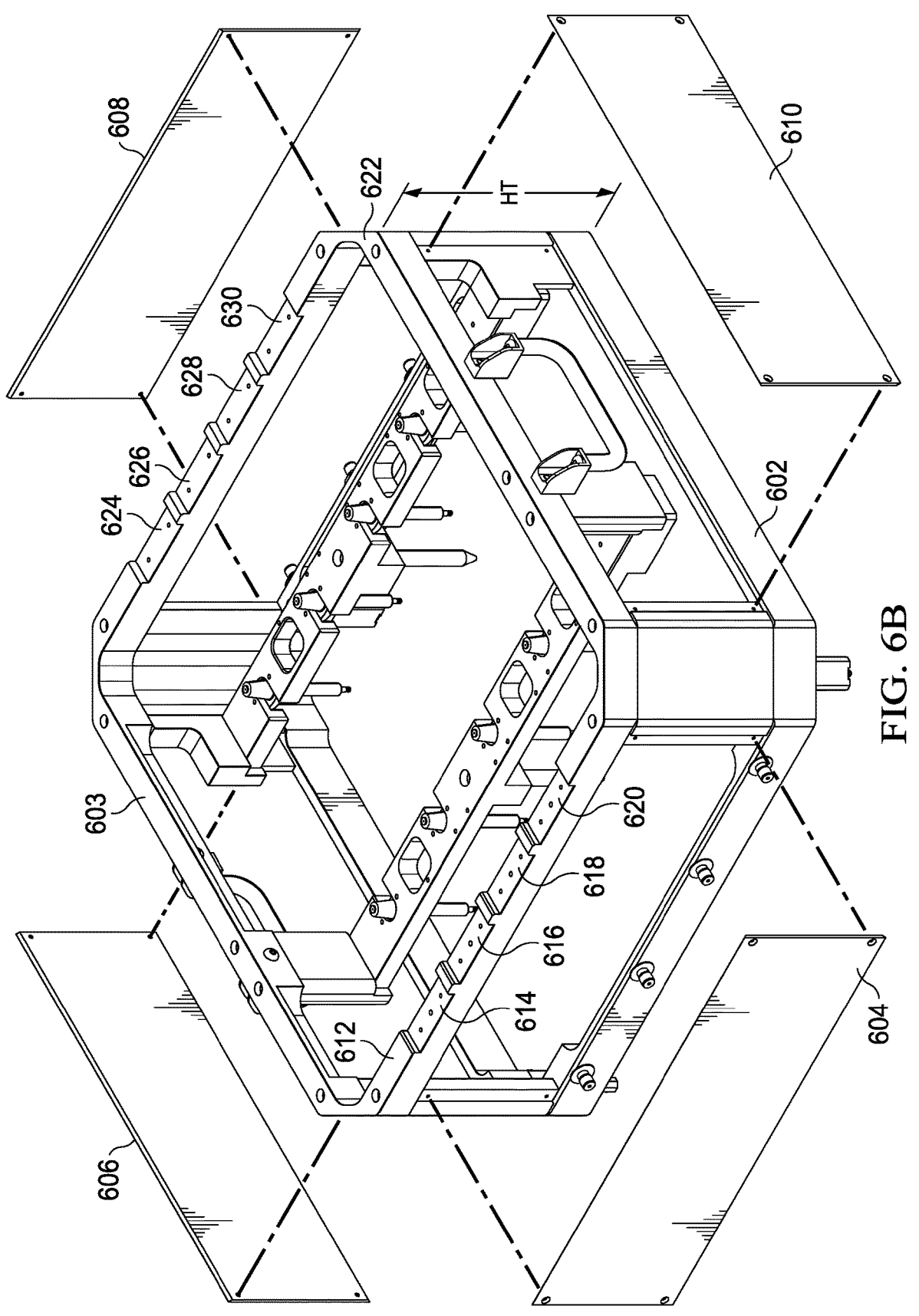
FIG. 6B illustrates a partial exploded perspective views of the contactor assembly without slabs.

FIGS. 6A and 6B illustrate partial exploded perspective views of the contactor assembly 108. The contactor assembly 108 includes a lower frame 602 and upper frame 603, both formed from a rigid material such as metal, and that presents a general perimeter and support for other of its components. The outer shape between the lower and upper frames 602 and 603 includes four sidewalls that include a portion of the metal frames 602 and 603, and a corresponding one of sidewall panels 604, 606, 608, and 610. Each of the sidewall panels 604, 606, 608, and 610 is preferably formed of a dielectric material to reduce weight and cost, and to provide favorable electrical characteristics, while also presenting a generally square or rectangular perimeter, for example forming between 50% and 75% of the sidewall area (e.g., 65%) and having dimensions, for example, of length of 12.5 inches and height of 4.0 inches. In an example embodiment, the combined height HT of the frames 602 and 603 and a corresponding one of the sidewall panels 604, 606, 608, and 610, is in the range of 6.0 to 7.0 (e.g., 6.2) inches, thereby providing favorable area within the frame for the remaining illustrated structure as well as cables for HV testing. An upper edge 612 of the frame 603 above the panel 604 includes four equally-dimensioned recesses 614, 616, 618, and 620, and an upper edge 622 of the frame 603602 above the panel 608 includes four equally-dimensioned recesses 624, 626, 628, and 630. A slab 410 is positioned in opposing and respective ones of these recesses, with a slab 410 between recesses 614 and 624, a slab 410 between recesses 616 and 626, a slab 410 between recesses 618 and 628, and a slab 410 between recesses 620 and 630.

Figure 7A:
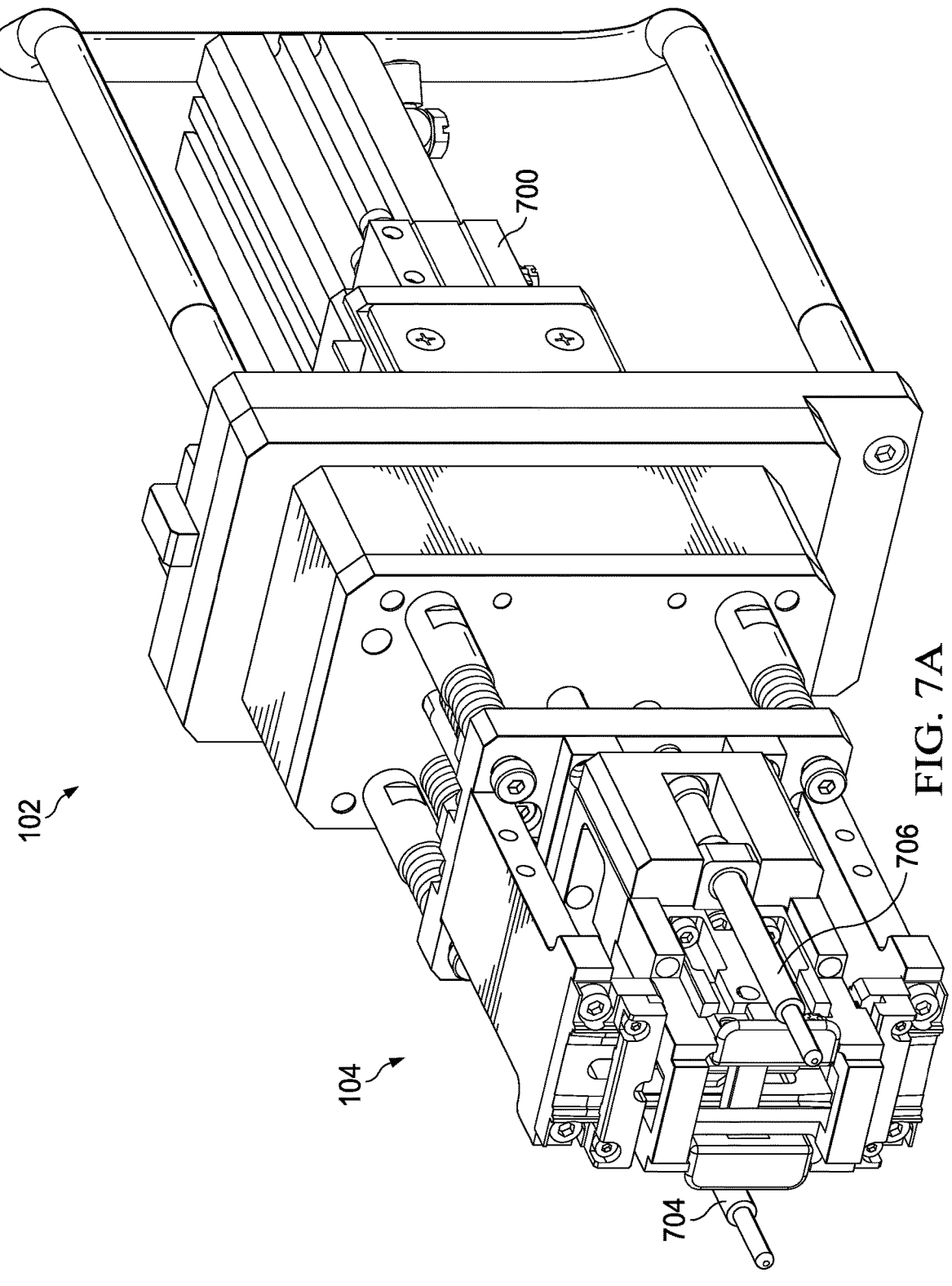
FIG. 7A illustrates a perspective view of the alignment relationship of the handler plunger and the plunger head in a retracted position.
Figure 7B:
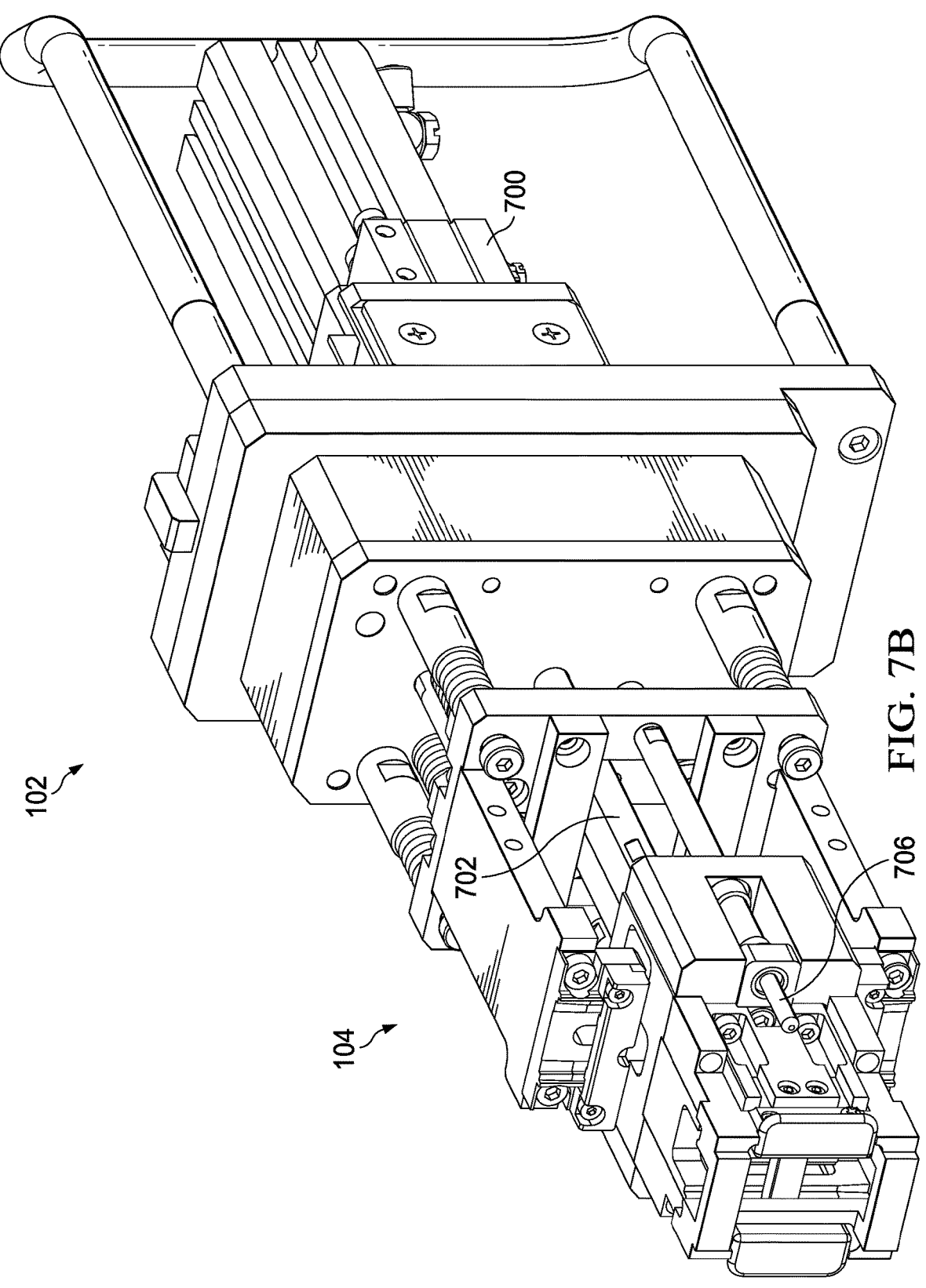
FIG. 7B illustrates the FIG. 7A view in a plunged position.

FIG. 7A illustrates a perspective view of the alignment relationship of the handler plunger 102 and the plunger head 104, in a retracted position, and FIG. 7B illustrates the FIG. 7A view in a plunged position. Generally, the handler plunger 102 includes an electromechanical actuator 700, operable to reciprocate a plunger 702, either to the extended position shown in FIG. 7B or the retracted position shown in FIG. 7A. Reciprocation of the plunger 702 concurrently extends or retracts the plunger head 104, and also can retract the top frame 214 within the plunger head by compressing against the springs 214_S (FIG. 2B) Particularly, and while not shown in FIGS. 7A and 7B, a distal end of the plunger 702, away from the electromechanical actuator 700, couples for example by the FIG. 2D Y-bar 104_Y, to a surface of the top frame 214 of the plunger head 104. Accordingly, as the plunger 702 extends, it advances the FIG. 2C top frame 214 toward the DUT 220, and likewise advances the top mold backer 212 and the top slug guide plates 222 and 224 in the same direction, whereby the hollow upper tube 218 contacts a surface of the DUT 220. As the hollow upper tube 218 compresses against the DUT 220, the entirety of the plunger head 104 is plunged away from the handler plunger 102, and the plunger head 104 may be guided in this manner by slide rods 704 and 706, until a stop position is reached. Such a stop position is shown partially in FIG. 4A, where the DUT 220 is electrically and physically coupled so that one side of the DUT leads are trapped between top and bottom slugs 226 and 230, and the opposing side of the DUT leads are trapped between top and bottom slugs 228 and 232, while at the same time the bottom slugs 228 and 232 are electrically and physically coupled respectively to the first and second electrodes 402 and 404. In this position, a HV test may be conducted relative to the DUT 220, after which the electromechanical actuator 700 retracts the plunger head to the position shown in FIG. 7B.

FIGS. 8A through 8H illustrate actuation of selected components of the handler plunger 102 and the plunger head 104 to receive the DUT 220, to plunge it to a test site for a HV test, and to retract so as to expel the DUT 220 after completing the HV test. Particularly, each of FIGS. 8A, 8C, 8E, and 8G illustrate a top view of the selected components, and each of FIGS. 8B, 8D, 8F, and 8H illustrate a side view of certain of those components.

Figure 8A:
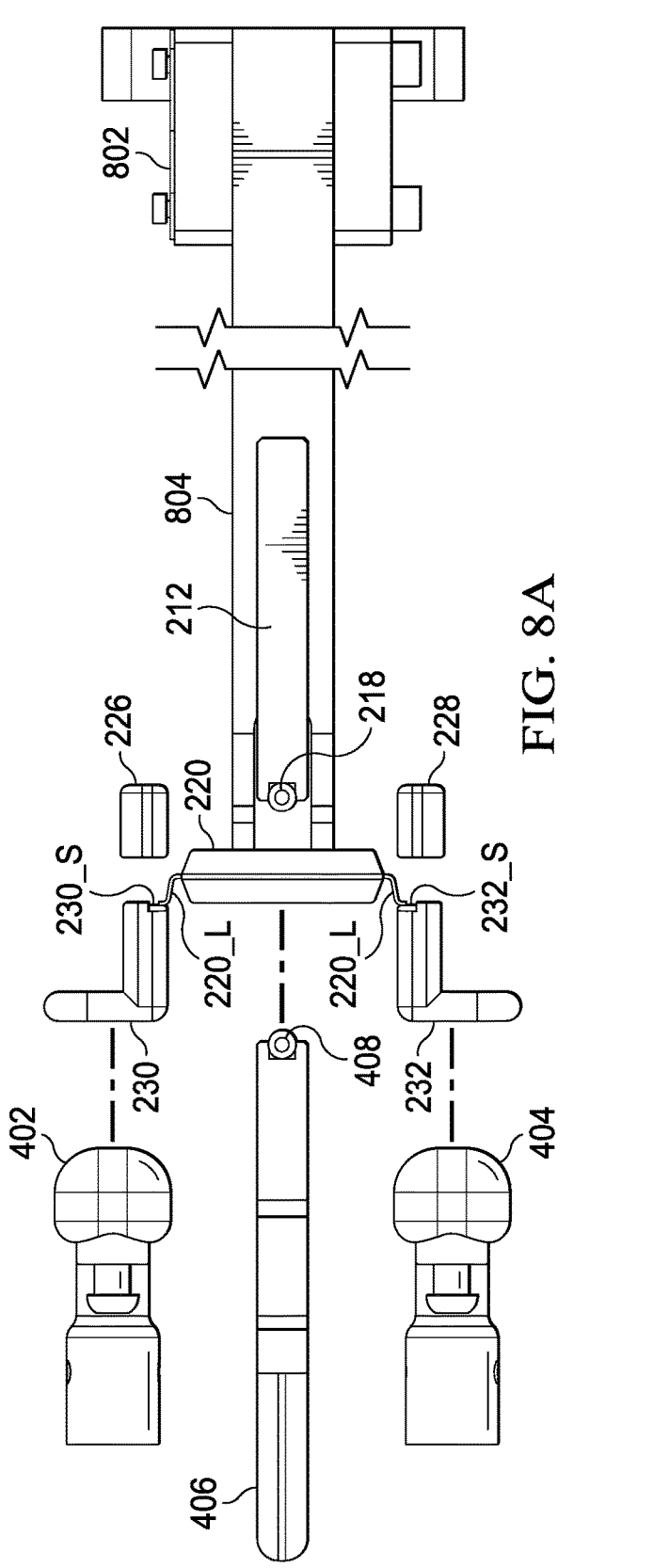
FIGS. 8A through 8H illustrate actuation of selected components of the handler plunger and the plunger head to receive the DUT, to plunge it to a test site for a HV test, and to retract so as to expel the DUT after completing the HV test.
Figure 8B:
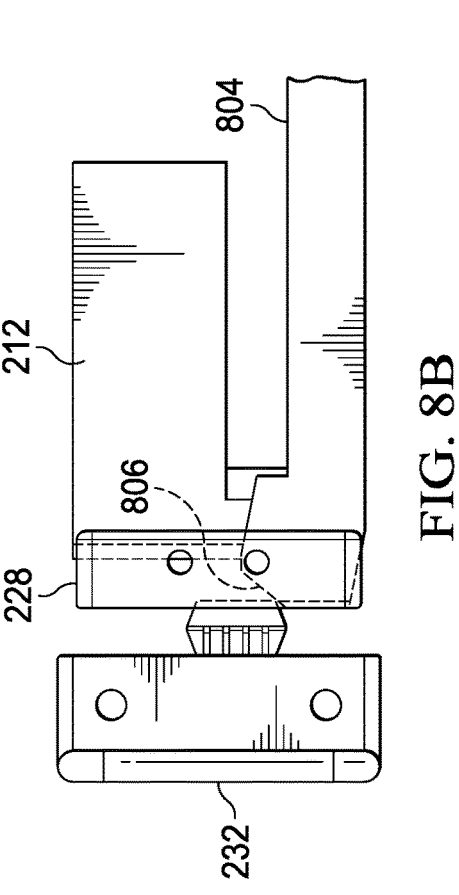

FIG. 8A illustrates various of the earlier-described components, which accordingly are not fully revisited in detail. Notably, FIG. 8A illustrates a separation between the top slugs 226 and 228 and the respective bottom slugs 230 and 232. Particularly, as the FIG. 7A plunger 702 retracts, it retracts the top of the FIG. 2B plunger base 200 toward, and eventually in contact with, a stop surface of the handler plunger 102; once that stop surface is contacted, any additional plunger 702 retraction will continue to pull the FIG. 2B top frame 214, within the cavity 200_C and against the bias of the springs 214_S, toward the posts 200_P. As that latter movement occurs, the top slugs 226 and 228 separate from the respective bottom slugs 230 and 232, resulting in the view of FIG. 8A. Separately, within the handler plunger 102 is included a head member 802, which can reciprocate by action of the FIGS. 7A and 7B electromechanical actuator 700. The head member 802 is physically coupled (e.g., by screws) to a mold stopper 804, which from the FIG. 8A top view is wider than the top mold backer 212. The FIG. 8B top view also illustrates that the mold stopper 804 is situated generally below the top mold backer 212, although the two may have shapes so as to avoid contact with one another, for example, with the mold stopper 804 having a longitudinal recess or void in which a portion of the top mold backer 212 can move without making contact with the mold stopper 804. The mold stopper 804 is so designated as it stops the "mold" (DUT 220) at a desirable position when the DUT 220 is loaded into the plunger head 104. Particularly as shown in the FIG. 8B side view, the mold stopper 804 includes a beveled end 806, where the bevel is shaped to receive an end of the DUT, that end being one of the two ends from which the leads are not protruding. For example, the DUT 220 may be dropped (gravity fed) to the mold stopper 804 and the mold stopper beveled end 806 catches the DUT 220 end so as to stop movement of the DUT 220 in the caught position. Accordingly, in the FIG. 8A top view, the DUT 220 is dropped so that its leads 220L align along the shelf 230_S and the shelf 232_S of the respective bottom slugs 230 and 232, while an edge of the DUT 220 situates against or within the beveled end 806. Meanwhile, at this time, note that the top mold backer 212, and its corresponding hollow upper tube 218, are in a retracted position so that the hollow upper tube 218 is not contacting the DUT 220, and also at the same time the top slugs 226 and 228 are not yet in contact with the bottom slugs 230 and 232.

Figure 8C:
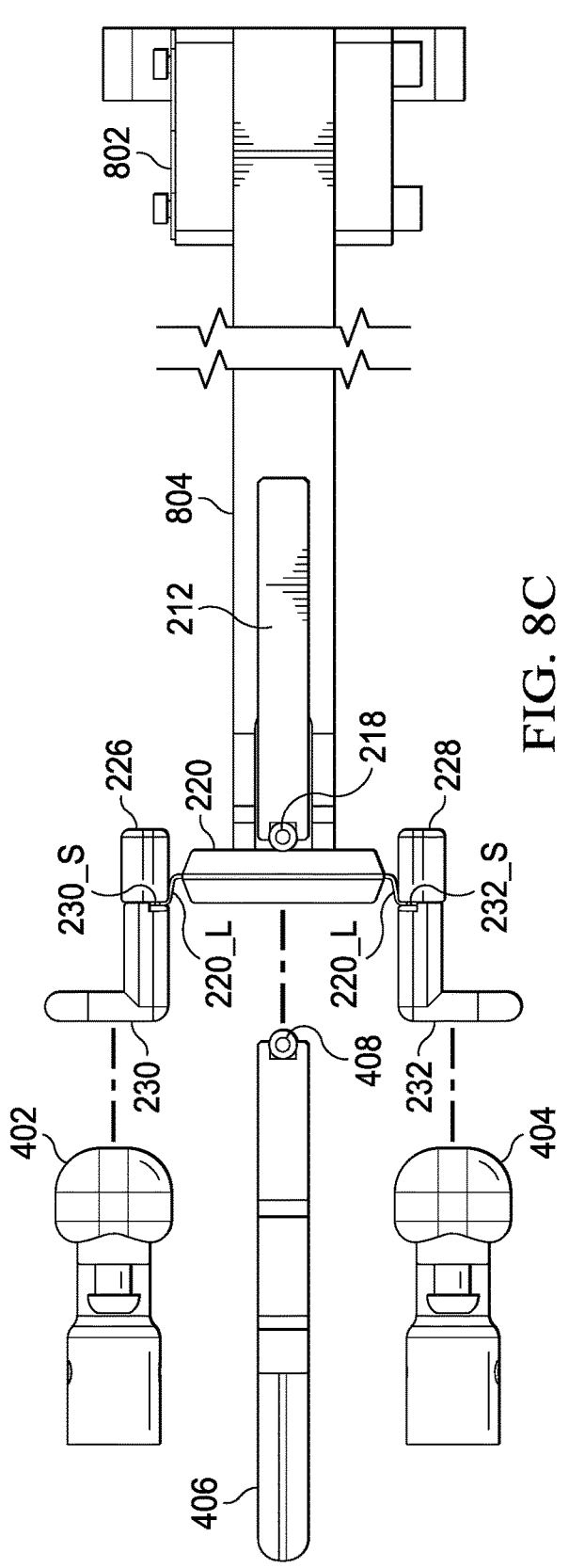
Figure 8D:
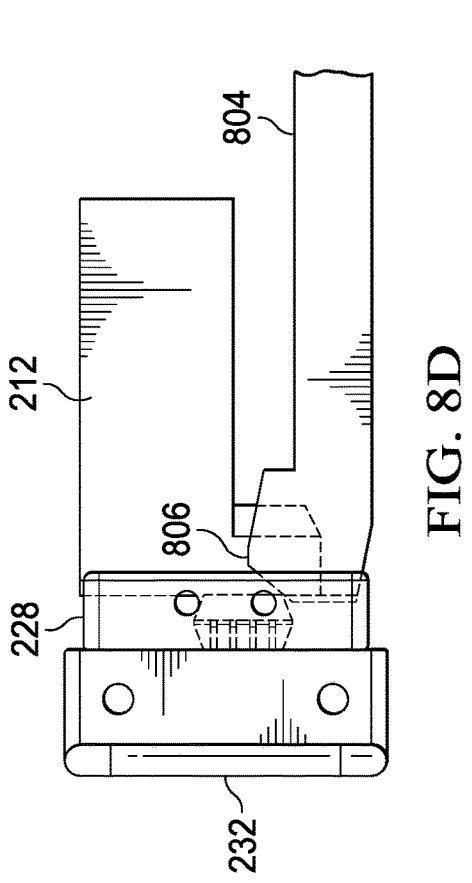

FIGS. 8C and 8D illustrate that the handler plunger 102 has actuated to extend the FIG. 2C top frame 214 toward the DUT 220. As a result, the top mold backer 212 plunges the hollow upper tube 218 to contact an upper surface of the DUT 220. Additionally, each of the top slug guide plates 222 and 224 (FIG. 2C) is likewise plunged (and forced by the FIG. 2B springs 214_S) so as to advance each top slug 226 and 228 toward a respective bottom slug 230 and 232, thereby trapping the leads 220_L between those structures. Meanwhile, the mold stopper 804, which is unaffected by movement of the top mold backer 212, remains in the same position as shown in FIG. 8A, where it stopped the loading of the DUT 220.

Figures 8E, 8F:
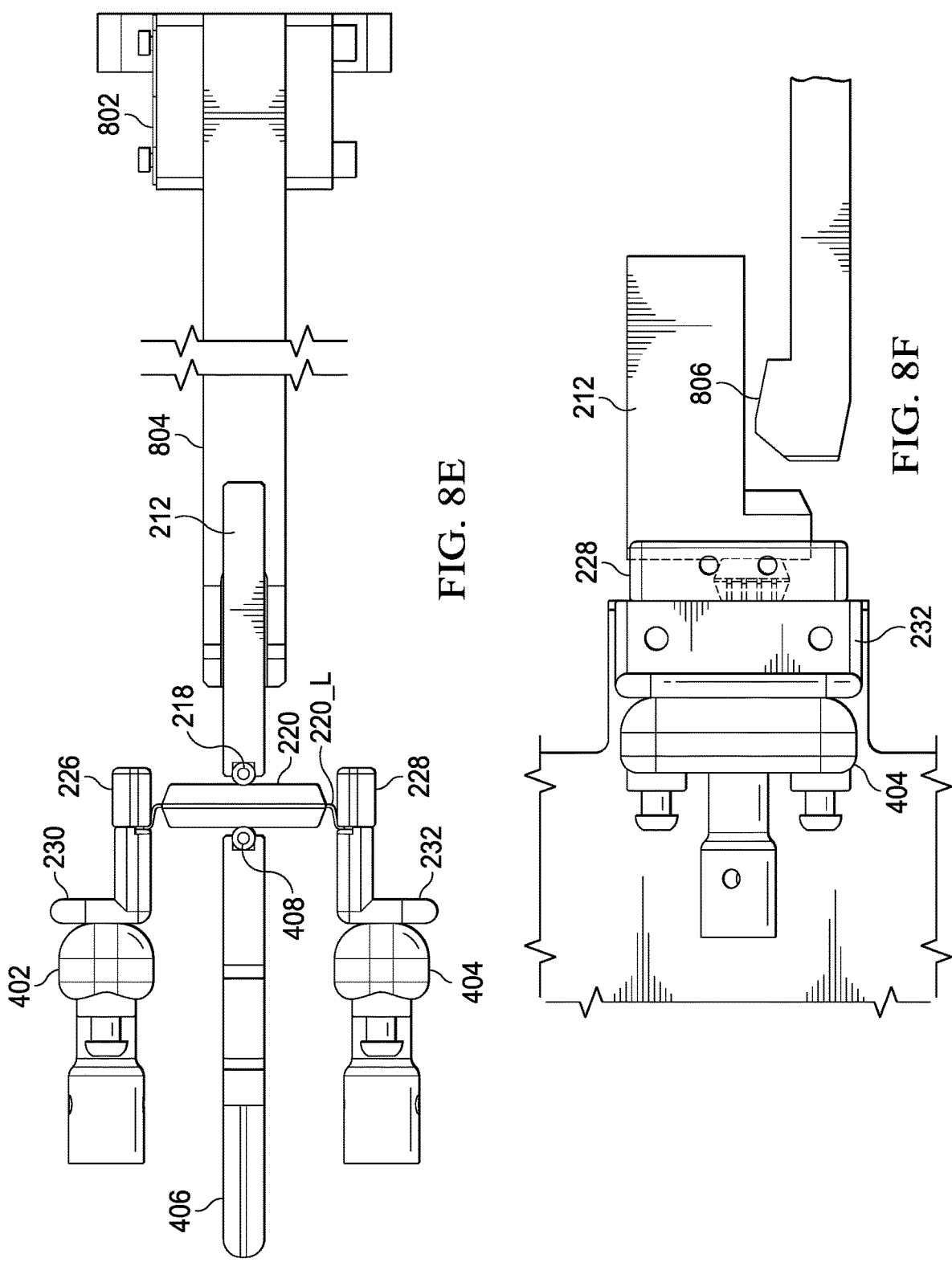

FIGS. 8E and 8F illustrate that the handler plunger 102 has actuated still further to extend the plunger head 104, while continuing the contact between the hollow upper tube 218 and an upper surface of the DUT 220, so that the DUT 220 plunges farther and a lower surface of the DUT 220 contacts the lower hollow lower tube 408. Additionally, each of the top slug guide plates 222 and 224 (FIG. 2C) is likewise further plunged so as to advance each top slug 226 and 228, already contacting a respective bottom slug 230 and 232 and leads 220_L, so that a lower surface of the bottom slug 230 physically and electrically couples to the first electrode 402 and a lower surface of the bottom slug 232 physically and electrically couples to the second electrode 404. Meanwhile, the mold stopper 804, which again is unaffected by movement of the top mold backer 212, remains in the same position as shown in FIG. 8A, but note there is a farther distance between it and the end of the top mold backer (e.g., 10.8 mm). Accordingly, in the positions illustrated in FIGS. 8E and 8F, the DUT 220 may be HV tested, while the mold stopper 804 is completely removed and distant from the plunger head 104, so as to reduce or minimize any effect it could have on affecting the electric field nearer the testing site of the DUT 220. Additionally, also during the HV testing, the apparatus and positioning described locates the top mold backer 212 between the (conductive) top slugs 226 and 228, and likewise it locates the vertical charge separation wall 406 between the (conductive) first and second electrodes 402 and 404; accordingly, each of the top mold backer 212 and the vertical charge separation wall 406 serves as a charge separation member between respective conductors during HV testing.

Figure 8G:
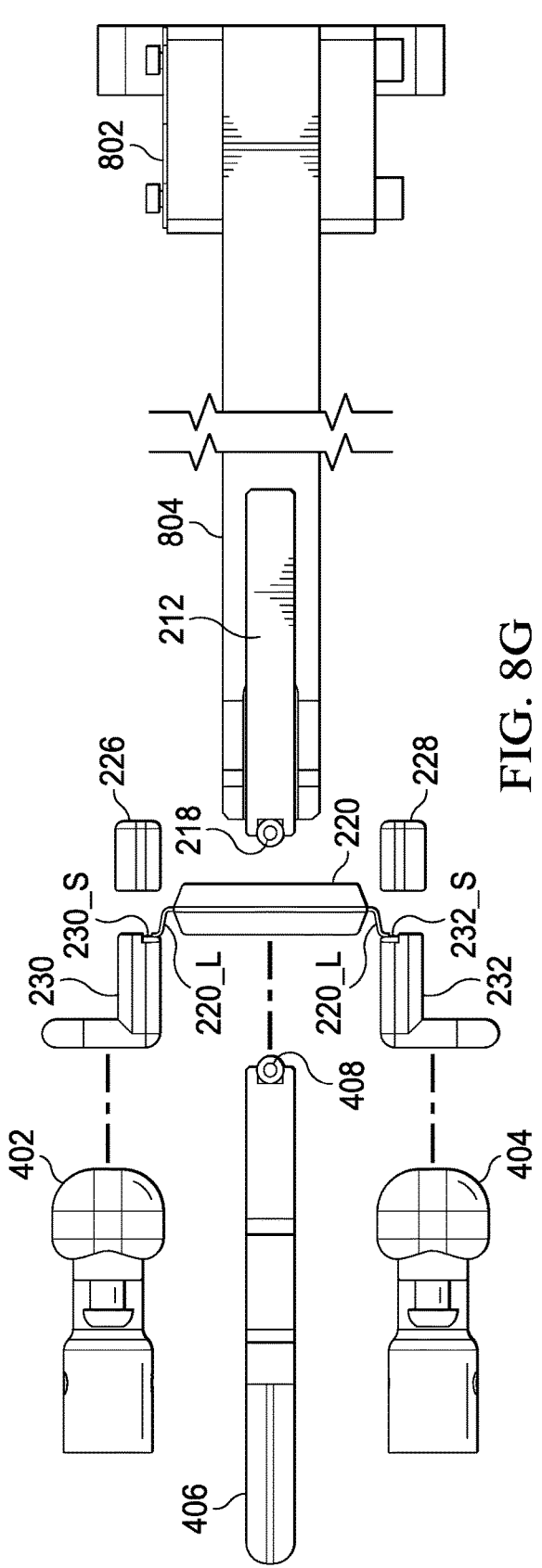
Figure 8H:
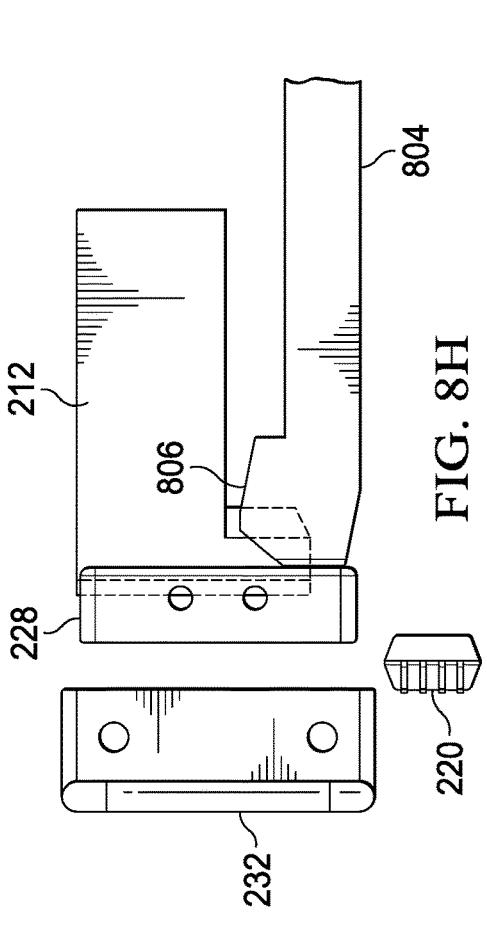

FIGS. 8G and 8H illustrate that the handler plunger 102 has retracted both the top mold backer 212 and the head member 802. The retraction of the top mold backer 212 separates the top hollow member 218 from the upper surface of the DUT 220, and at the same time each of the top slug guide plates 222 and 224 retracts, thereby separating (FIG. 2C) the top slugs 226 and 228 from the respective bottom slugs 230 and 232. The retraction of the head member 802 retracts the corresponding attached mold stopper 804, so that the lower edge of the DUT 220 is no longer retained by the beveled end 806 and, accordingly, the DUT 220 may fall away by gravity, as shown in FIG. 8H.

With the various attributes described above, the applied HV is connected to the DUT 220, but with a reduced chance of test error that might arise from either partial discharge or a full arc occurring outside of the DUT 220, that is, between other parts of the testing architecture. Indeed, with the illustrated embodiments, higher test voltages (between the electrodes) may be applied without resulting in false fails, that otherwise might occur in the prior art due to a test board causing partial discharge or arcing. The reduced test error can be attributed to various aspects of the illustrated example embodiment, including but not limited to apparatus configuration, actuation, size, shape, geometry, material, and location. Further, while the above-described attributes are shown in combination, the inventive scope includes subsets of one or more features in other embodiments. Still further, also contemplated are changes in various parameters, including dimensions, with the preceding providing only some examples, with others ascertainable, from the teachings herein, by one skilled in the art. Accordingly, additional modifications are possible in the described embodiments, and other embodiments are possible, within the scope of the following claims.

What is claimed is:

1. An integrated circuit testing interface system, comprising:
   a first slug configured to contact a first surface of a first set of pins of an integrated circuit;
   a second slug configured to contact a second surface of the first set of pins of the integrated circuit;
   a third slug configured to contact a first surface of a second set of pins of the integrated circuit; and
   a fourth slug configured to contact a second surface of the second set of pins of the integrated circuit.

2. The integrated circuit testing interface system of claim 1:
   wherein the first surface of a first set of pins of an integrated circuit is opposite the second surface of a first set of pins of an integrated circuit; and
   wherein the first surface of a second set of pins of an integrated circuit is opposite the second surface of a second set of pins of an integrated circuit.

3. The integrated circuit testing interface system of claim 2:
   wherein the first set of pins of an integrated circuit are along a first side of the integrated circuit; and wherein the second set of pins of an integrated circuit are along a second side of the integrated circuit, opposite the first side of the integrated circuit.

4. The integrated circuit testing interface system of claim 1 and further including:
   a first movable unit configured to couple the first slug and the second slug to the first set of pins of the integrated circuit; and
   a second movable unit configured to couple the third slug and the fourth slug to the second set of pins of the integrated circuit.

5. The integrated circuit testing interface system of claim 4 wherein the first movable unit and the second movable unit are configured to move concurrently.

6. The integrated circuit testing interface system of claim 4 and further including an actuator configured to concurrently move the first movable unit and the second movable unit.

7. The integrated circuit testing interface system of claim 1:
   wherein the second slug includes a second slug surface configured to physically and electrically couple to a first electrode of a high voltage test site; and
   wherein the fourth slug includes a fourth slug surface configured to physically and electrically couple to a second electrode of the high voltage test site.

8. The integrated circuit testing interface system of claim 7 and further including:
   a first movable unit configured to couple the first slug and the second slug to the first set of pins of the integrated circuit and to couple the second slug surface to the first electrode; and
   a second movable unit configured to couple the third slug and the fourth slug to the second set of pins of the integrated circuit and to couple the fourth slug surface to the second electrode.

9. The integrated circuit testing interface system of claim 1 and further including a first charge separation member between the first slug and the third slug.

10. The integrated circuit testing interface system of claim 9 and further including a second charge separation member between the second slug and the fourth slug.

11. An integrated circuit testing interface system, comprising:
   a first slug configured to contact a first surface of a first set of pins of an integrated circuit;
   a second slug configured to contact a second surface of the first set of pins of the integrated circuit;
   a third slug configured to contact a first surface of a second set of pins of the integrated circuit;
   a fourth slug configured to contact a second surface of the second set of pins of the integrated circuit;
   a first charge separation member between the first slug and the third slug; and
   a first hollow dielectric cylinder coupled between the first charge separation member and a first surface of the integrated circuit.

12. An integrated circuit testing interface system, comprising:
   a first slug configured to contact a first surface of a first set of pins of an integrated circuit;
   a second slug configured to contact a second surface of the first set of pins of the integrated circuit;
   a third slug configured to contact a first surface of a second set of pins of the integrated circuit;
   a fourth slug configured to contact a second surface of the second set of pins of the integrated circuit;

a first charge separation member between the first slug and the third slug;

a second charge separation member between the second slug and the fourth slug; and a first hollow dielectric cylinder coupled between the first charge separation member and a first surface of the integrated circuit; and a second hollow dielectric cylinder coupled between the second charge separation member and a second surface of the integrated circuit.

13. The integrated circuit testing interface system of claim 12 wherein the first surface of the integrated circuit is opposite the second surface of the integrated circuit.

14. An integrated circuit testing interface system, comprising:

a frame, the frame including metal and dielectric sidewalls; and a plurality of integrated circuit test sites coupled to the frame, wherein each test site in the plurality of integrated circuit test sites includes a respective slab and a respective pair of electrodes; and a charge separation member between the electrodes.

15. The integrated circuit testing interface system of claim 14 wherein at least one sidewall in the sidewalls includes an area that is 50% to 75% dielectric.

16. The integrated circuit testing interface system of claim 14 wherein each sidewall in the sidewalls includes an area that is 50% to 75% dielectric.

17. The integrated circuit testing interface system of claim 14 wherein the charge separation member is directly between the electrodes.

18. The integrated circuit testing interface system of claim 17 wherein the charge separation member extends above the electrodes.

19. The integrated circuit testing interface system of claim 17 wherein the charge separation member extends above and below the electrodes.

20. An integrated circuit testing interface system, comprising:

a frame, the frame including metal and dielectric sidewalls;

a plurality of integrated circuit test sites coupled to the frame;

wherein each test site in the plurality of integrated circuit test sites includes a respective slab and a respective pair of electrodes; and wherein the respective pair of electrodes include a structure extending above a first surface and a second surface, opposite the first surface, of the respective slab, and each test site in the plurality of integrated circuit test sites includes:

a first insulating wall surrounding a majority of the structure extending above the first surface of the respective slab; and a second insulating wall surrounding a majority of the structure extending above the second surface of the respective slab.

21. The integrated circuit testing interface system of claim 20 wherein the first insulating wall surrounds an entire perimeter around the structure extending above the first surface of the respective slab.

22. An integrated circuit testing interface system, comprising:

a frame; and a plurality of integrated circuit test sites coupled to the frame, each test site in the plurality of integrated circuit test sites including:

a respective slab;

a respective pair of electrodes;

a respective pair of springs, each spring in the respective pair of springs configured to spring bias a respective electrode in the respective pair of electrodes relative to the respective slab; and a respective pair of metal sleeves, each sleeve in the respective pair of metal sleeves surrounding a respective spring in the respective pair of springs.

23. The integrated circuit testing interface system of claim 22, each test site in the plurality of integrated circuit test sites including:

a first pair of springs configured to spring bias a first respective electrode in the respective pair of electrodes relative to the respective slab;

a second pair of springs configured to spring bias a first respective electrode in the respective pair of electrodes relative to the respective slab; and a metal sleeve surrounding each respective spring in the first pair of springs and the second pair of springs.

* * * * *